United States Patent
Yamazaki et al.

(10) Patent No.: US 9,816,173 B2
(45) Date of Patent: Nov. 14, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Shunpei Yamazaki, Setagaya (JP); Masahiro Takahashi, Atsugi (JP); Motoki Nakashima, Atsugi (JP); Takashi Shimazu, Nagoya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 178 days.

(21) Appl. No.: 13/657,196

(22) Filed: Oct. 22, 2012

(65) Prior Publication Data

US 2013/0105792 A1    May 2, 2013

(30) Foreign Application Priority Data

Oct. 28, 2011 (JP) ................. 2011-236577

(51) Int. Cl.
  *H01L 29/786* (2006.01)
  *C23C 14/08* (2006.01)
  (Continued)

(52) U.S. Cl.
  CPC .......... *C23C 14/08* (2013.01); *C23C 14/3414* (2013.01); *H01L 29/7869* (2013.01);
  (Continued)

(58) Field of Classification Search
None
See application file for complete search history.

(56) References Cited

U.S. PATENT DOCUMENTS 5,731,856 A   3/1998  Kim et al.
5,744,864 A   4/1998  Cillessen et al.
(Continued)

FOREIGN PATENT DOCUMENTS

EP   1737044 A   12/2006
EP   2226847 A   9/2010
(Continued)

OTHER PUBLICATIONS

Kumomi et al. Amorphous oxide channel TFTs. Feb. 15, 2008. Elsevier: Thin Solid Films. vol. 516, Issue 7, pp. 1516-1522. DOI: 10.1016/j.tsf.2007.03.161.*

(Continued)

*Primary Examiner* — Hoang-Quan Ho
(74) *Attorney, Agent, or Firm* — Eric J. Robinson; Robinson Intellectual Property Law Office, P.C.

(57) ABSTRACT

A material suitable for a semiconductor included in a transistor, a diode, or the like is provided. The material is an oxide material including In, M1, M2 and Zn, in which M1 is an element in the group 13 of the periodic table, a typical example thereof is Ga, and M2 is an element whose content is less than the content of M1. Examples of M2 are Ti, Zr, Hf, Ge, Sn, and the like. To contain M2 leads to suppression of generation of oxygen vacancies in the oxide material. A transistor which includes as few oxygen vacancies as possible can be achieved, whereby reliability of a semiconductor device can be increased.

17 Claims, 21 Drawing Sheets

(51) Int. Cl.
  *C23C 14/34* (2006.01)
  *H01L 21/02* (2006.01)
  *G02F 1/1368* (2006.01)
(52) U.S. Cl.
  CPC ........ *G02F 1/1368* (2013.01); *H01L 21/0237* (2013.01); *H01L 21/02554* (2013.01); *H01L 21/02565* (2013.01); *H01L 21/02631* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,763,981 B2 | 7/2010 | Yamazaki et al. |
| 7,910,490 B2 | 3/2011 | Akimoto et al. |
| 7,932,521 B2 | 4/2011 | Akimoto et al. |
| 8,158,974 B2 | 4/2012 | Yano et al. |
| 8,222,092 B2 | 7/2012 | Yamazaki et al. |
| 8,274,077 B2 | 9/2012 | Akimoto et al. |
| 8,492,757 B2 | 7/2013 | Sakata et al. |
| 8,624,400 B2 | 1/2014 | Yamazaki et al. |
| 8,674,972 B2 * | 3/2014 | Kurokawa et al. ........... 345/207 |
| 8,779,419 B2 | 7/2014 | Yano et al. |
| 8,872,175 B2 | 10/2014 | Sakata et al. |
| 8,916,870 B2 | 12/2014 | Sakata et al. |
| 9,059,296 B2 * | 6/2015 | Kim .................... H01L 27/1225 |
| 9,324,878 B2 | 4/2016 | Sakata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0011979 A1 * | 1/2006 | Moriwaki ..................... 257/347 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152214 A1 | 7/2007 | Hoffman et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008638 A1 | 1/2009 | Kang et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0211903 A1 | 8/2009 | Lee et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0051949 A1 | 3/2010 | Yamazaki et al. |
| 2010/0065844 A1 | 3/2010 | Tokunaga |
| 2010/0084650 A1 | 4/2010 | Yamazaki et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0163868 A1 | 7/2010 | Yamazaki et al. |
| 2011/0006302 A1 * | 1/2011 | Yamazaki ........... H01L 27/1225 257/43 |
| 2011/0101333 A1 * | 5/2011 | Shionoiri et al. ............... 257/43 |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0147738 A1 * | 6/2011 | Yamazaki et al. ............. 257/43 |
| 2011/0163311 A1 | 7/2011 | Akimoto et al. |
| 2011/0168993 A1 * | 7/2011 | Jeon .................... H01L 29/7869 257/43 |
| 2011/0168994 A1 | 7/2011 | Kawashima et al. |
| 2011/0210328 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |
| 2011/0240988 A1 * | 10/2011 | Yano et al. ...................... 257/43 |
| 2011/0267330 A1 | 11/2011 | Yamazaki et al. |
| 2012/0018727 A1 * | 1/2012 | Endo et al. ....................... 257/57 |
| 2012/0032164 A1 * | 2/2012 | Ohnuki .............................. 257/43 |
| 2012/0184066 A1 | 7/2012 | Yano et al. |
| 2012/0313093 A1 * | 12/2012 | Kim .................... H01L 27/1225 257/43 |

(56) References Cited

U.S. PATENT DOCUMENTS

| | | | |
|---|---|---|---|
| 2012/0315730 A1* | 12/2012 | Koezuka | H01L 29/78618 438/158 |
| 2012/0319175 A1* | 12/2012 | Endo et al. | 257/255 |
| 2013/0009111 A1 | 1/2013 | Morita et al. | |
| 2013/0075732 A1* | 3/2013 | Saito | H01L 29/7869 257/57 |
| 2013/0075733 A1 | 3/2013 | Saito et al. | |
| 2013/0087790 A1 | 4/2013 | Yamazaki | |
| 2013/0092944 A1* | 4/2013 | Honda | H01L 21/02554 257/57 |
| 2013/0134413 A1 | 5/2013 | Yamazaki et al. | |
| 2016/0204269 A1 | 7/2016 | Sakata et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-134454 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2009-016844 A | 1/2009 |
| JP | 2010-018479 A | 1/2010 |
| JP | 2010-232647 A | 10/2010 |
| JP | 2011-108873 A | 6/2011 |
| JP | 2011-146694 A | 7/2011 |
| TW | 200849469 | 12/2008 |
| TW | 200948995 | 12/2009 |
| WO | WO-2004/114391 | 12/2004 |
| WO | WO-2008/117739 | 10/2008 |
| WO | WO-2011/040028 | 4/2011 |
| WO | WO-2011/074407 | 6/2011 |
| WO | WO-2011/126093 | 10/2011 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C; "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

(56) References Cited

OTHER PUBLICATIONS

Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTS,", IDW '09 : Proceedings of the 16th International Display Workshops, 2009, pp. 689-692.
Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.
Osada.T et al., "Development of Driver-Integrated Panel Using Amorphous In—Ga—Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTS With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies In ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

(56) References Cited

OTHER PUBLICATIONS

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.
International Search Report (Application No. PCT/JP2012/077171) Dated Jan. 29, 2013.
Written Opinion (Application No. PCT/JP2012/077171) Dated Jan. 29, 2013.

\* cited by examiner

● In
○ Ga
○ Zn
● O excess oxygen

In ◯  Ga ●  Zn ◦  O ●  Ti ●

SEMICONDUCTOR DEVICE AND MANUFACTURING METHOD THEREOF

TECHNICAL FIELD

The present invention relates to a semiconductor device using an oxide semiconductor and a manufacturing method thereof.

In this specification, the "semiconductor device" means any device which can function by utilizing semiconductor characteristics, and an electrooptic device, a semiconductor circuit, and an electronic device are all included in the category of the "semiconductor device".

BACKGROUND ART

In recent years, attention has been drawn to a technique for forming a thin film transistor (TFT) by using a semiconductor thin film formed over a substrate having an insulating surface. Thin film transistors are applied to a wide range of electronic devices such as ICs or electro-optical devices, and prompt development of thin film transistors that are to be used as switching elements for image display devices, in particular, is being pushed. Various metal oxides are used for a variety of applications.

Some metal oxides have semiconductor characteristics. Examples of such metal oxides having semiconductor characteristics are a tungsten oxide, a tin oxide, an indium oxide, a zinc oxide, and the like. A thin film transistor in which such a metal oxide having semiconductor characteristics is used for a channel formation region is known (Patent Documents 1 and 2).

Further, there is a description that a zinc oxide, a magnesium zinc oxide, or a cadmium zinc oxide is used as a semiconductor in Patent Document 3.

REFERENCE

Patent Document 1: Japanese Published Patent Application No. 2007-123861
Patent Document 2: Japanese Published Patent Application No. 2007-096055
Patent Document 3: U.S. Pat. No. 6,727,522

DISCLOSURE OF INVENTION

An object of one embodiment of the present invention is to provide a material suitable for a semiconductor included in a transistor, a diode, or the like. Specifically, an object of one embodiment of the present invention is to provide a method for manufacturing an oxide semiconductor layer with fewer oxygen vacancies, and a material obtained by the method.

One embodiment of the present invention is an oxide material including In, M1, M2, and Zn, in which M1 is an element in the group 13 of the periodic table and M2 is an element whose content is less than that of M1. The content of M2 is greater than or equal to 1% and less than 50% of that of M1. Specifically, the oxide material is represented as being $InM1_xM2_yZn_z$-based ($0<X\leq1$, $0<Y<1$, $Y<X$, and $0<Z$), a typical example of M1 is Ga, and the content of M2 is greater than or equal to 1% and less than 50%, preferably greater than or equal to 3% and less than or equal to 40% of that of Ga, whereby generation of oxygen vacancies in the material is suppressed. The value X is not necessarily a natural number.

Specifically, Ga used as a typical example of M1 in the above-described material is a trivalent element and one or more of Ga atoms is/are replaced with a quadrivalent element(s). Since the number of inherent bonds of the quadrivalent element is greater than that of inherent bonds of the trivalent element by one, that replacement leads to less generation of oxygen vacancies. The quadrivalent element, M2 is Ti, Zr, Hf, Ge, Sn, or the like. The above-described material is a non-single crystal.

The above-described material includes few or no heavy-metal impurities/impurity other than the constituent elements; the purity of the above-described material is greater than or equal to 3N, preferably greater than or equal to 4N.

Further, a semiconductor device in which the above-described oxide material including In, M1, M2, and Zn is used for a semiconductor layer is one embodiment of the present invention. The structure includes a gate electrode layer, a gate insulating layer overlapping with the gate electrode layer, and an oxide semiconductor layer which overlaps with the gate electrode layer with the gate insulating layer provided therebetween. The oxide semiconductor layer is formed of the oxide material including In, M1, M2, and Zn, in which M1 is an element in the group 13 of the periodic table and M2 is an element whose content is less than that of M1. A typical example of the element M1 is Ga, the content of M2 is greater than or equal to 1% and less than 50%, preferably greater than or equal to 3% and less than or equal to 40% of that of Ga, and M2 acts as a stabilizer, which enables a transistor whose semiconductor layer includes less oxygen vacancies to be realized, so that the reliability of the transistor can be improved.

According to one embodiment of the present invention, generation of oxygen vacancies in an oxide semiconductor material can be suppressed. Further, the use of the above-described oxide semiconductor material for a channel formation region of a transistor enables an improvement of the reliability of the transistor.

BRIEF DESCRIPTION OF DRAWINGS

In the accompanying drawings.

BEST MODE FOR CARRYING OUT THE INVENTION

Hereinafter, embodiments and examples of the present invention are described in detail with reference to the accompanying drawings. However, the present invention is not limited to the description below, and it is easily understood by those skilled in the art that modes and details disclosed herein can be modified in various ways. Therefore, the present invention is not construed as being limited to description of the following embodiments and examples.

(Embodiment 1)

Figure 1A:
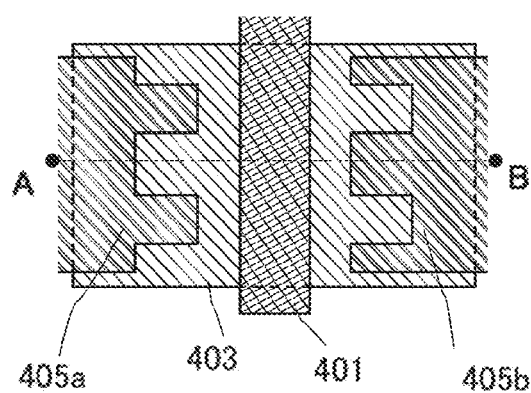
FIGS. 1A to 1D are plan views and cross-sectional views illustrating embodiments of the present invention.

In this embodiment, one embodiment of a semiconductor device and a method for manufacturing the semiconductor device is described using FIG. 1A.

Figure 1B:
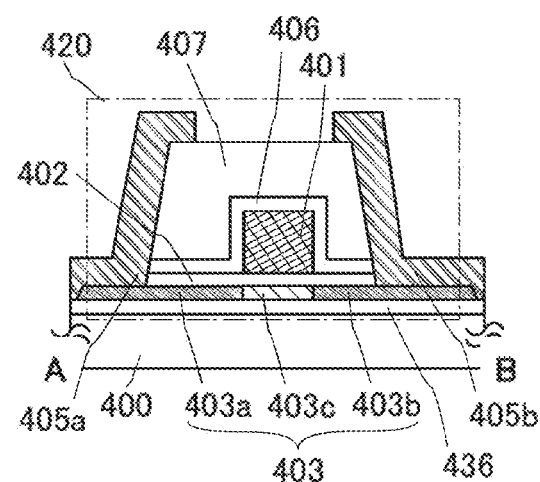

A plan view and a cross-sectional view of a transistor 420 as one example of a semiconductor device are shown in FIGS. 1A and 1B. FIG. 1A is a plan view of the transistor 420, and FIG. 1B is a cross-sectional view taken along line A-B in FIG. 1A. Some components of the transistor 420 (e.g., an insulating layer 407) are not illustrated for simplicity in FIG. 1A.

The transistor 420 illustrated in FIGS. 1A and 1B includes a base insulating layer 436 provided over a substrate 400, an oxide semiconductor layer 403 over the base insulating layer 436, a gate insulating layer 402 over the oxide semiconductor layer 403, a gate electrode layer 401 provided over the oxide semiconductor layer 403 with the gate insulating layer 402 provided therebetween, an insulating layer 406 and the insulating layer 407 which are provided over the gate electrode layer 401, and a source electrode layer 405a and a drain electrode layer 405b which are electrically connected to the oxide semiconductor layer 403 through openings formed in the gate insulating layer 402, the insulating layer 406, and the insulating layer 407.

Further, in the transistor 420, the oxide semiconductor layer 403 preferably includes a channel formation region 403c with which the gate electrode layer 401 overlaps, and low-resistance regions 403a and 403b between which the channel formation region 403c is sandwiched and in which the resistance is lower than that of the channel formation region 403c and dopant is included. The low-resistance regions 403a and 403b can be formed in a self-aligned manner after formation of the gate electrode layer 401 by introducing an impurity element using the gate electrode layer 401 as a mask. The low-resistance regions 403a and 403b can function as a source region and a drain region of the transistor 420. Provision of the low-resistance regions 403a and 403b leads to relaxation of an electric field applied to the channel formation region 403c between the pair of low-resistance regions. Further, the structure in which the source electrode layer 405a and the drain electrode layer 405b are in contact with their respective low-resistance regions leads to a reduction in contact resistance between the oxide semiconductor layer 403 and each of the source electrode layer 405a and the drain electrode layer 405b.

In this embodiment, an oxide material represented as being $InM1_XM2_YZn_Z$-based ($0<X\leq1$, $0<Y<1$, $Y<1$, $Y<X$ and $0<Z$) is used for the oxide semiconductor layer 403. Specifically, an InGaTiZn oxide film deposited by a sputtering method using a target of In:Ga:Ti:Zn=3:0.95:0.05:2 is used for the oxide semiconductor layer 403. This oxide semiconductor layer 403 can be regarded as an $InGa_XTi_YZn_Z$-based (X=0.32, Y=0.02, Z=0.67) oxide material. In this oxide material, the ratio of the content of Ti to the content of Ga (=0.02/0.32) is 0.0625, about 6.3%.

It is preferable that before the formation of the oxide semiconductor layer 403, the substrate 400 be heated so that moisture and the like on the substrate or the like are removed. As the substrate 400, any of the following can be used: a single crystal semiconductor substrate or a polycrystalline semiconductor substrate of silicon, silicon carbide, or the like, a compound semiconductor substrate of silicon germanium or the like, an SOI substrate, a glass substrate, a ceramic substrate, a quartz substrate, a sapphire substrate, and the like. It is also preferable to perform a heat treatment or the like to remove moisture and the like on a surface of the base insulating layer 436 after the formation of the base insulating layer 436.

As the heat treatment, a heat treatment by heat conduction or heat radiation from a medium such as a heated gas (rapid thermal anneal (RTA)) may be performed. For example, as an example of the RTA, a gas rapid thermal anneal (GRTA), a lamp rapid thermal anneal (LRTA), or the like can be used. In the LRTA, an object is heated by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, a heat treatment is performed with a high-temperature gas. An inert gas is used as the gas. The heat treatment by the RTA for a short time enables the substrate not to strain even at a temperature higher than or equal to the strain point of the substrate, which allows an efficient dehydration or dehydrogenation treatment.

A resistance heating method may also be used; for example, the substrate temperature is higher than or equal to 500° C. and lower than or equal to 650° C. and the process time is longer than or equal to 1 minute and shorter than or equal to 10 minutes. The heat treatment is performed at a temperature higher than or equal to 300° C. and lower than the strain point of the substrate, preferably higher than or equal to 400° C. and lower than or equal to 650° C. in an inert atmosphere, a reduced-pressure atmosphere, or a dry air atmosphere. The inert atmosphere refers to an atmosphere containing an inert gas (such as nitrogen or a rare gas (e.g., helium, neon, argon, krypton, or xenon)) as its main component, and preferably contains no hydrogen. For example, the purity of the inert gas to be introduced is 8N (99.999999%) or more, preferably 9N (99.9999999%) or more. Alternatively, the inert atmosphere refers to an atmosphere that contains an inert gas as its main component and in which the concentration of a reactive gas is less than 0.1 ppm. The reactive gas is a gas that reacts with a semiconductor, metal, or the like. The reduced-pressure atmosphere refers to a pressure of 10 Pa or less. The dry air atmosphere is an atmosphere at a dew point lower than or equal to −40° C., preferably lower than or equal to −50° C.

In this embodiment, the oxide semiconductor layer 403 is preferably a c-axis aligned crystalline oxide semiconductor (CAAC-OS) film.

The CAAC-OS film is not neither completely single crystal nor completely amorphous. The CAAC-OS film is an oxide semiconductor layer with a crystal-amorphous mixed phase structure where crystalline portions are included in an amorphous phase. In most cases, the size of each crystalline portion fits inside a cube whose one side is less than 100 nm. From an observation image obtained with a transmission electron microscope (TEM), a boundary between the amorphous part and the crystalline portion in the CAAC-OS film is not clear. Further, with the TEM, a grain boundary is not found in the CAAC-OS film. Thus, it is suggested that in the CAAC-OS film, a reduction in electron mobility due to the grain boundary is suppressed.

In the crystalline portions included in the CAAC-OS film, the c-axis is aligned in a direction perpendicular to a surface where the CAAC-OS film is formed or a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Among the crystalline portions, the directions of the a-axis and the b-axis may differ from each other. In this specification and the like, being simply "perpendicular" refers to being in a range from 85° to 95° both inclusive.

In the CAAC-OS film, distribution of crystalline portions is not necessarily uniform. For example, in the formation process of the CAAC-OS film, in the case where crystal growth starts from a surface side of the oxide semiconductor film, the proportion of crystalline portions is higher in the vicinity of the surface of the CAAC-OS film than in the vicinity of the surface where the CAAC-OS film is formed in some cases.

Since the c-axes of the crystalline portions included in the CAAC-OS film are aligned in the direction perpendicular to the surface where the CAAC-OS film is formed or the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). The direction of c-axis of the crystalline portion comes to be the direction perpendicular to the surface where the CAAC-OS film is formed or the surface of the CAAC-OS film in an as-deposited state. The crystalline portions are formed by film deposition or by performing a treatment for crystallization such as a heat treatment after film deposition.

The use of the CAAC-OS film as the oxide semiconductor layer 403 enables change in electric characteristics of the transistor due to irradiation with visible light or ultraviolet light to be less. Thus, the transistor has high reliability.

Further, the use of the oxide material represented as being $InM1_XM2_YZn_Z$-based ($0<X\leq1$, $0<Y<1$, $Y<X$, and $0<Z$) as the oxide semiconductor layer 403 enables generation of oxygen vacancies in the oxide semiconductor layer 403 to be less. The suppression of generation of oxygen vacancies in the oxide semiconductor layer 403 leads to an increase in the reliability.

(Embodiment 2)

Figure 1C:
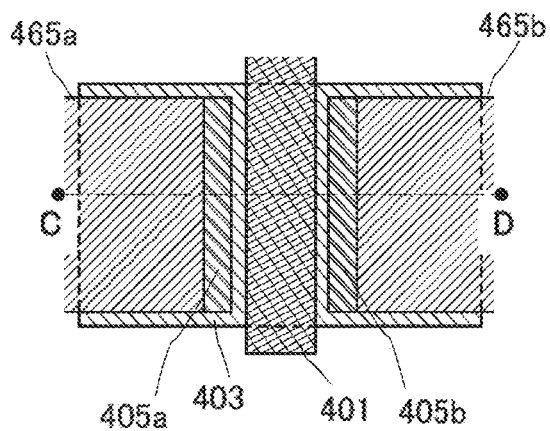
Figure 1D:
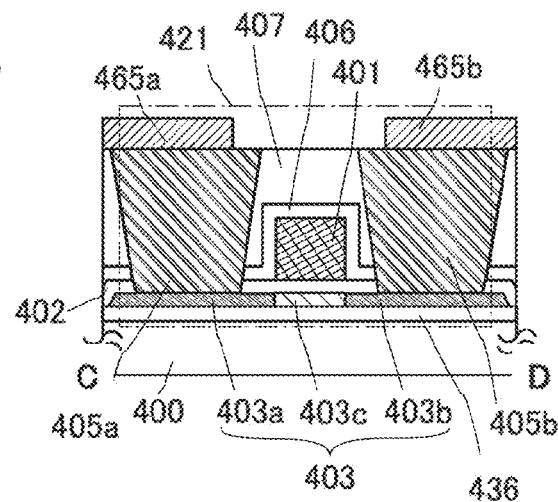

In this embodiment, an example of a structure which is different from Embodiment 1 is described using FIGS. 1C and 1D. Portions which are the same as those in Embodiment 1 are denoted by the same reference numerals, and detail description thereof is skipped for simplicity.

FIG. 1C is a plan view of a transistor 421, and FIG. 1D is a cross-sectional view taken along line C-D in FIG. 1C. The transistor 421 illustrated in FIG. 1C includes a base insulating layer 436 provided over a substrate 400, an oxide semiconductor layer 403 over the base insulating layer 436, a gate insulating layer 402 over the oxide semiconductor layer 403, a gate electrode layer 401 provided over the oxide semiconductor layer 403 with the gate insulating layer 402 provided therebetween, an insulating layer 406 and an insulating layer 407 which are provided over the gate electrode layer 401, a source electrode layer 405a and a drain electrode layer 405b which are electrically connected to the oxide semiconductor layer 403 through openings formed in the gate insulating layer 402, the insulating layer 406, and the insulating layer 407, and a source wiring layer 465a and a drain wiring layer 465b which are provided on and in contact with the source electrode layer 405a and the drain electrode layer 405b, respectively.

In the transistor 421, the source electrode layer 405a and the drain electrode layer 405b are formed to fill the openings formed in the gate insulating layer 402 and the insulating layers 406 and 407 to be in contact with the oxide semiconductor layer 403. These electrode layers are formed as follows: a conductive film is formed over the insulating layer 407 to fill the openings which reach the oxide semiconductor layer 403 and are formed in the gate insulating layer 402 and the insulating layers 406 and 407; a polishing treatment is performed on the conductive film to remove a part of the conductive film just above the insulating film 407 (a region which is overlapped with at least the gate electrode layer 401), so that the conductive film is divided.

In the transistor 421, the width between the source electrode layer 405a and the drain electrode layer 405b in the channel length direction is smaller than that between the source wiring layer 465a and the drain wiring layer 465b in the channel length direction. Further, the width between the source electrode layer 405a and the drain electrode layer 405b in the channel length direction is smaller in the transistor 421 than in the transistor 420 described in Embodiment 1; thus, the transistor 421 is smaller than the transistor 420.

Further, for the gate electrode layer 401, the source electrode layer 405a, the drain electrode layer 405b, the source wiring layer 465a, and the drain wiring layer 465b, a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like can be used.

In this embodiment, an oxide material represented as being $InM1_XM2_YZn_Z$-based ($0<X\leq1$, $0<Y<1$, $Y<X$ and $0<Z$) is used for the oxide semiconductor layer 403. Specifically, an InGaGeZn oxide film deposited by a sputtering method using a target of In:Ga:Ge:Zn=3:0.95:0.05:2 is used for the oxide semiconductor layer 403.

The use of the oxide material represented as being $InM1_XM2_YZn_Z$-based ($0<X\leq1$, $0<Y<1$, $Y<X$ and $0<Z$) as the oxide semiconductor layer 403 enables generation of oxygen vacancies in the oxide semiconductor layer 403 to be less. The suppression of generation of oxygen vacancies in the oxide semiconductor layer 403 leads to an increase in the reliability.

This embodiment can be combined with Embodiment 1 as appropriate.

(Embodiment 3)

Figure 2A:
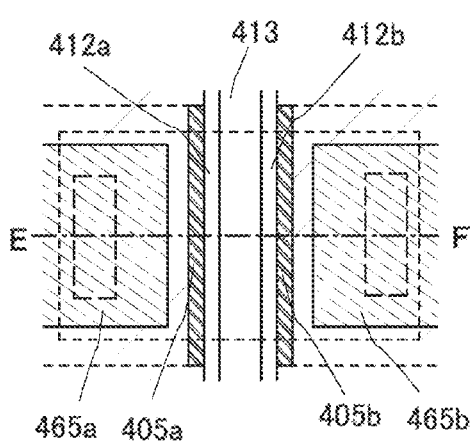
FIGS. 2A to 2D are plan views and cross-sectional views illustrating embodiments of the present invention.
Figure 2B:
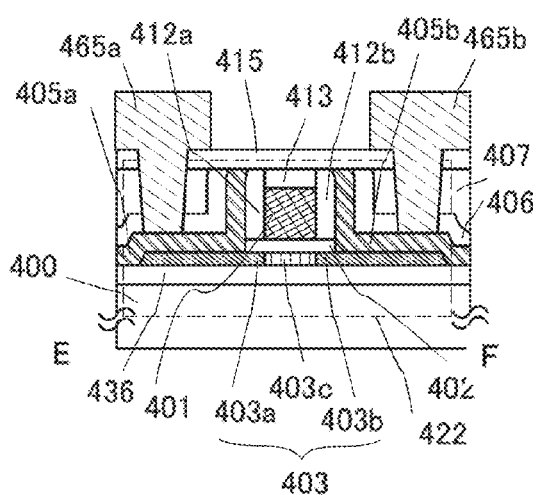

In this embodiment, an example of a structure which is different from Embodiment 1 is described using FIGS. 2A and 2B. Portions which are the same as those in Embodiment 1 are denoted by the same reference numerals, and detail description thereof is skipped for simplicity.

FIG. 2A is a plan view of a transistor 422, and FIG. 2B is a cross-sectional view taken along line E-F in FIG. 2A.

As illustrated in FIG. 2B that is the cross-sectional view in the channel length direction, the transistor 422 includes over a substrate 400 provided with a base insulating layer 436, an oxide semiconductor layer 403 including a channel formation region 403c and low-resistance regions 403a and 403b, a source electrode layer 405a, a drain electrode layer 405b, a gate insulating layer 402, a gate electrode layer 401, sidewall insulating layers 412a and 412b provided on sides of the gate electrode layer 401, an insulating layer 413 provided over the gate electrode layer 401, and an insulating layer 406 and an insulating layer 407 which are provided over the source electrode layer 405a and the drain electrode layer 405b. An insulating layer 415 is formed to cover the transistor 422. Respective openings reaching the source electrode layer 405a and the drain electrode layer 405b are formed in the insulating layers 406, 407, and 415, and a source wiring layer 465a and a drain wiring layer 465b are provided over the insulating layer 415.

The source electrode layer 405a and the drain electrode layer 405b are formed as follows: a conductive film is formed over the insulating layer 413 to cover the sidewall insulating layers 412a and 412b; and a polishing treatment is performed on the conductive film to remove part of the conductive film just above the insulating layer 413 (a region which is overlapped with at least the gate electrode layer 401), so that the conductive film is divided.

The source electrode layer 405a and the drain electrode layer 405b are in contact with the sidewall insulating layer 412a and the sidewall insulating layer 412b, respectively, and an exposed portion of a top surface of the oxide semiconductor layer 403. Therefore, the distance between the gate electrode layer 401 and a region (contact region) in which the oxide semiconductor layer 403 is in contact with the source electrode layer 405a or the drain electrode layer 405b corresponds to a width of the sidewall insulating layer 412a or 412b in the channel length direction, which enables miniaturization of the transistor and less variation in electric characteristics of the transistor caused by the manufacturing process.

The reduction in the distance between the gate electrode layer 401 and the region (contact region) in which the oxide semiconductor layer 403 is in contact with the source electrode layer 405a or the drain electrode layer 405b leads to a reduction in the resistance between the gate electrode layer 401 and the region (contact region) in which the oxide semiconductor layer 403 is in contact with the source electrode layer 405a or the drain electrode layer 405b, whereby the on-state characteristics of the transistor 422 can be increased.

The gate insulating layer 402 can be formed using a silicon oxide, a gallium oxide, an aluminum oxide, a silicon nitride, a silicon oxynitride, an aluminum oxynitride, a silicon nitride oxide, or the like. It is preferable that the gate insulating layer 402 include oxygen in a portion which is in contact with the oxide semiconductor layer 403. In particular, it is preferable that the oxygen content of the gate insulating layer 402 in (a bulk of) the film be in excess of that in the stoichiometric composition; for example, in the case where a silicon oxide film is used as the gate insulating layer 402, the composition formula thereof is preferably $SiO_{2+\alpha}$ ($\alpha$>0). In this embodiment, a silicon oxide film of $SiO_{2+\alpha}$ ($\alpha$>0) is used as the gate insulating layer 402. By using this silicon oxide film as the gate insulating layer 402, oxygen can be supplied to the oxide semiconductor layer 403, leading to favorable characteristics. Further, the gate insulating layer 402 is preferably formed in consideration of the size of a transistor to be formed and the step coverage with the gate insulating layer 402.

The use of a high-k material such as a hafnium oxide, an yttrium oxide, a hafnium silicate ($HfSi_XO_Y$ (X>0, Y>0)), a hafnium silicate to which nitrogen is added ($HfSiO_XN_Y$ (X>0, Y>0)), a hafnium aluminate ($HfAl_XO_Y$ (X>0, Y>0)), or a lanthanum oxide for the gate insulating layer 402 enables a gate leakage current to be less. Further, the gate insulating layer 402 has either a single-layer structure or a stacked-layer structure.

Further, for the base insulating layer 436, the insulating layer 413, the sidewall insulating layers 412a and 412b, and the insulating layers 406, 407, and 415, materials appropriately selected from the above-described materials for the gate insulating layer can be used. Any of the insulating layers 407 and 415 can also be formed using an organic material such as a polyimide resin, an acrylic resin, or a benzocyclobutene-based resin as well as the above-described materials.

In this embodiment, an oxide material represented as being $InM1_XM2_YZn_Z$-based (0<X≤1, 0<Y<1, Y<X and 0<Z) is used for the oxide semiconductor layer 403. Specifically, an InGaZrZn oxide film deposited by a sputtering method using a target of In:Ga:Zr:Zn=3:0.95:0.05:2 is used for the oxide semiconductor layer 403.

The use of the oxide material represented as being $InM1_XM2_YZn_Z$-based (0<X≤1, 0<Y<1, Y<X and 0<Z) as the oxide semiconductor layer 403 enables generation of oxygen vacancies in the oxide semiconductor layer 403 to be less. The suppression of generation of oxygen vacancies in the oxide semiconductor layer 403 leads to an increase in the reliability.

This embodiment can be combined with Embodiment 1 or Embodiment 2 as appropriate.

(Embodiment 4)

Figure 2C:
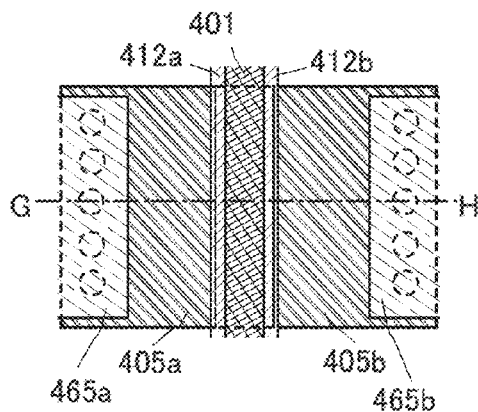
Figure 2D:
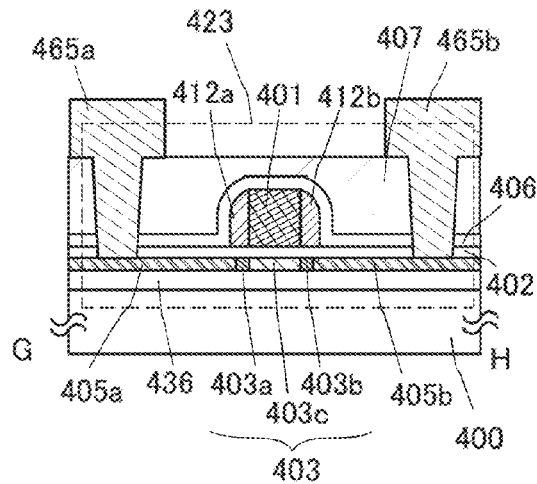

In this embodiment, an example of a structure which is different from Embodiment 1 is described using FIGS. 2C and 2D. Portions which are the same as those in Embodiment 1 are denoted by the same reference numerals, and detail description thereof is skipped for simplicity.

FIG. 2C is a plan view of a transistor 423, and FIG. 2D is a cross-sectional view taken along line G-H in FIG. 2C.

The transistor 423 illustrated in FIGS. 2C and 2D includes a base insulating layer 436 provided over a substrate 400, a source electrode layer 405a and a drain electrode layer 405b, an oxide semiconductor layer 403 including a channel formation region 403c and low-resistance regions 403a and 403b which are sandwiched between the source electrode layer 405a and the drain electrode layer 405b, a gate insulating layer 402 which is in contact with respective top surfaces of the oxide semiconductor layer 403 and the source electrode layer 405a and the drain electrode layer 405b, a gate electrode layer 401 which is provided over the oxide semiconductor layer 403 with the gate insulating layer 402 provided therebetween, a sidewall insulating layer 412a which is in contact with one side of the gate electrode layer 401 in the channel length direction, a sidewall insulating layer 412b which is in contact with the other side of the gate electrode layer 401 in the channel length direction, insulating layers 406 and 407 which cover the gate electrode layer 401, and a source wiring layer 465a and a drain wiring layer 465b which are provided over the insulating layer 407 and be in contact with the source electrode layer 405a and the drain electrode layer 405b, respectively.

The low-resistance regions 403a and 403b are not necessarily provided in the oxide semiconductor layer 403. In that case, one side surface of the channel formation region 403c in the channel length direction is in contact with the source electrode layer 405a, and the other side surface of the channel formation region 403c in the channel length direction is in contact with the drain electrode layer 405b.

The level of the top surface of the oxide semiconductor layer 403 is equal to that of each of the top surfaces of the drain electrode layer 405b and the source electrode layer 405a. A conductive film for forming the source electrode layer and the drain electrode layer (including a wiring formed of the same layer) is formed over an island-shaped oxide semiconductor layer, and a polishing (cutting or grinding) treatment is performed thereon to remove part of the conductive film to expose the top surface of the oxide semiconductor layer 403.

In this embodiment, an oxide material represented as being InM1$_X$M2$_Y$Zn$_Z$-based (0<X≤1, 0<Y<1, Y<X and 0<Z) is used for the oxide semiconductor layer 403. Specifically, an InGaSnZn oxide film deposited by a sputtering method using a target of In:Ga:Sn:Zn=3:0.95:0.05:2 is used for the oxide semiconductor layer 403.

The use of the oxide material represented as being InM1$_X$M2$_Y$Zn$_Z$-based (0<X≤1, 0≤Y<1, Y<X and 0<Z) as the oxide semiconductor layer 403 enables generation of oxygen vacancies in the oxide semiconductor layer 403 to be less. The suppression of generation of oxygen vacancies in the oxide semiconductor layer 403 leads to an increase in the reliability.

This embodiment can be combined with any one of Embodiments 1 to 3 as appropriate.

(Embodiment 5)

Examples of a top-gate structure are described in Embodiments 1 to 4. In this embodiment, an example of a bottom-gate structure (also referred to as a channel stop structure) is described.

Figure 3A:
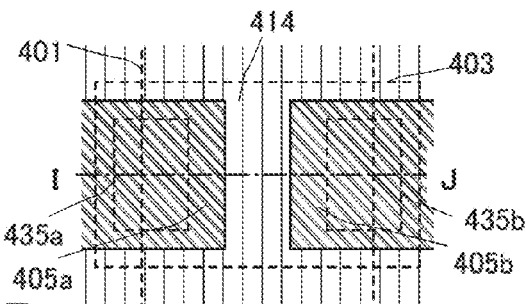
FIGS. 3A to 3E are plan views and cross-sectional views illustrating embodiments of the present invention.
Figure 3B:
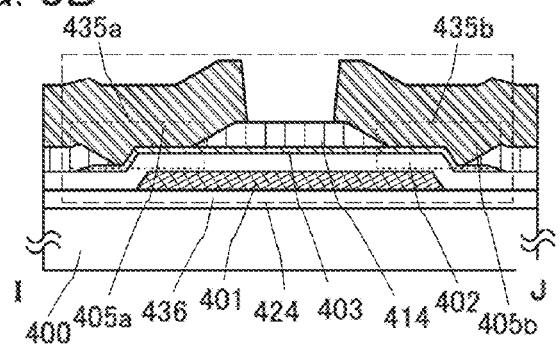

FIG. 3A is a plan view of a transistor 424, and FIG. 3B is a cross-sectional view taken along line I-J in FIG. 3A.

As illustrated in FIG. 3B that is the cross-sectional view in the channel length direction, the transistor 424 includes, over a substrate 400 provided with a base insulating layer 436, a gate electrode layer 401, a gate insulating layer 402, an oxide semiconductor layer 403, an insulating layer 414, a source electrode layer 405a, and a drain electrode layer 405b.

The insulating layer 414 in contact with the oxide semiconductor layer 403 is provided over a channel formation region of the oxide semiconductor layer 403, which overlaps with the gate electrode layer 401, and functions as a channel protective film. The insulating layer 414 has an opening 435a and an opening 435b which reach the oxide semiconductor layer 403 and whose inner walls are covered with the source electrode layer 405a and the drain electrode layer 405b, respectively. Accordingly, the insulating layer 414 covers the periphery of the oxide semiconductor layer 403, and thus functions also as an interlayer insulating film. Not only the gate insulating layer 402 but also the insulating layer 414 functioning as an interlayer insulating film is provided at the intersection of a gate wiring and a source wiring, whereby parasitic capacitance can be reduced.

The insulating layer 414 can be formed using a silicon oxide, a gallium oxide, an aluminum oxide, a silicon nitride, a silicon oxynitride, an aluminum oxynitride, a silicon nitride oxide, or the like.

Further, the insulating layer 414 is either a single layer or a stacked layer. In the case of the stacked layer, the pattern shape may be changed by a plurality of etching steps, so that an end portion of a lower layer is not aligned with an end portion of an upper layer, i.e., the end portion of the lower layer protrudes out of the end portion of the upper layer in the cross-sectional structure.

In this embodiment, an oxide material represented as being InM1$_X$M2$_Y$Zn$_Z$-based (0<X≤1, 0<Y<1, Y<X and 0<Z) is used for the oxide semiconductor layer 403. Specifically, an InGaTiZn oxide film deposited by a sputtering method using a target of In:Ga:Ti:Zn=1:0.95:0.05:1 is used for the oxide semiconductor layer 403.

The use of the oxide material represented as being InM1$_X$M2$_Y$Zn$_Z$-based (0<X≤1, 0<Y<1, Y<1, Y<X and 0<Z) as the oxide semiconductor layer 403 enables generation of oxygen vacancies in the oxide semiconductor layer 403 to be less. The suppression of generation of oxygen vacancies in the oxide semiconductor layer 403 leads to an increase in the reliability.

This embodiment can be combined with any one of Embodiments 1 to 4 as appropriate.

(Embodiment 6)

Figure 3C:
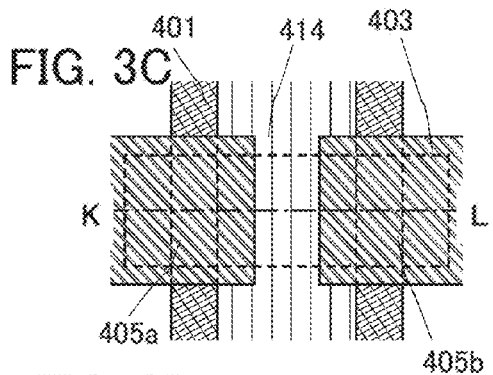
Figure 3E:
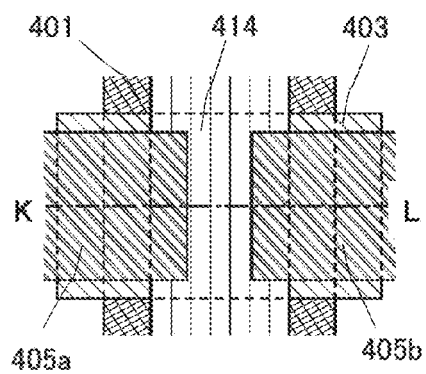
Figure 3D:
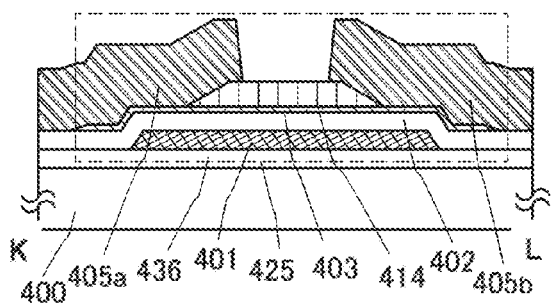

In this embodiment, an example of a structure which is partly different from Embodiment 5 is described using FIGS. 3C and 3D.

FIG. 3C is a plan view of a transistor 425, and FIG. 3D is a cross-sectional view taken along line K-L in FIG. 3C.

As illustrated in FIG. 3D that is the cross-sectional view in the channel length direction, the transistor 425 includes, over a substrate 400 provided with a base insulating layer 436, a gate electrode layer 401, a gate insulating layer 402, an oxide semiconductor layer 403, an insulating layer 414, a source electrode layer 405a, and a drain electrode layer 405b.

The insulating layer 414 in contact with the oxide semiconductor layer 403 is provided over a channel formation region of the oxide semiconductor layer 403, which overlaps with the gate electrode layer 401, and functions as a channel protective film.

In the plan view of FIG. 3C, the source electrode layer 405a and the drain electrode layer 405b are provided to cover a periphery of the oxide semiconductor layer 403. However, embodiments of the present invention are not limited thereto; for example, as illustrated in a plan view of FIG. 3E, the source electrode layer 405a and the drain electrode layer 405b may be provided to expose the periphery of the oxide semiconductor layer 403, in the case of which the exposed portion of the oxide semiconductor layer 403 may be contaminated by an etching gas or the like in an etching for formation of the source electrode layer 405a and the drain electrode layer 405b. In that case, after the etching for the formation of the source electrode layer 405a and the drain electrode layer 405b, a plasma treatment (with an N$_2$O gas or an O$_2$ gas) or cleaning (with water or diluted hydrofluoric acid (at 100 times dilution)) is preferably performed on the exposed portion of the oxide semiconductor layer

403. The structure illustrated in FIG. 3E is the same as that illustrated in FIG. 3C except the pattern shape of the oxide semiconductor layer 403.

In this embodiment, an oxide material represented as being $InM1_XM2_YZn_Z$-based ($0<X\leq1$, $0<Y<1$, $Y<X$ and $0<Z$) is used for the oxide semiconductor layer 403. Specifically, an InGaHfZn oxide film deposited by a sputtering method using a target of In:Ga:Hf:Zn=1:0.95:0.05:1 is used for the oxide semiconductor layer 403.

The use of the oxide material represented as being $InM1_XM2_YZn_Z$-based ($0<X\leq1$, $0<Y<1$, $Y<1$, $Y<X$ and $0<Z$) as the oxide semiconductor layer 403 enables generation of oxygen vacancies in the oxide semiconductor layer 403 to be less. The suppression of generation of oxygen vacancies in the oxide semiconductor layer 403 leads to an increase in the reliability.

This embodiment can be combined with any one of Embodiments 1 to 5 as appropriate.

(Embodiment 7)

Figure 4A:
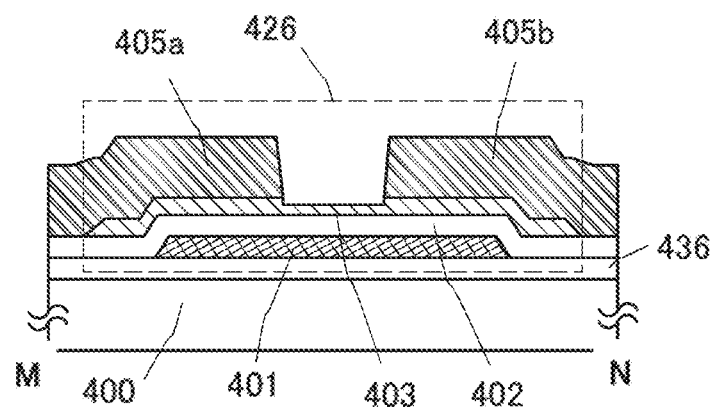
FIGS. 4A to 4C are a cross-sectional view and plan views illustrating embodiments of the present invention.
Figure 4B:
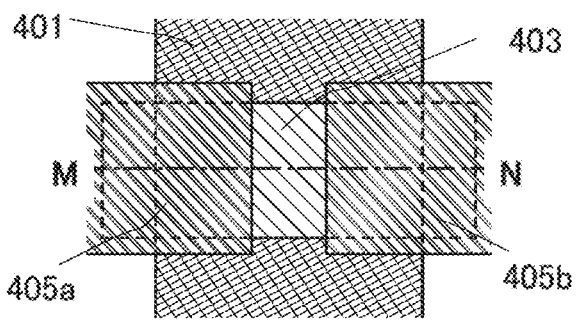

In this embodiment, an example of a structure which is partly different from Embodiment 5 is described using FIGS. 4A and 4B.

In this embodiment, an example of a bottom-gate structure (also referred to as a channel etch structure) is described.

FIG. 4B is a plan view of a transistor 426, and FIG. 4A is a cross-sectional view taken along line M-N in FIG. 4B.

As illustrated in FIG. 4A that is the cross-sectional view in the channel length direction, the transistor 426 includes, over a substrate 400 provided with a base insulating layer 436, a gate electrode layer 401, a gate insulating layer 402, an oxide semiconductor layer 403, a source electrode layer 405*a*, and a drain electrode layer 405*b*.

Figure 4C:
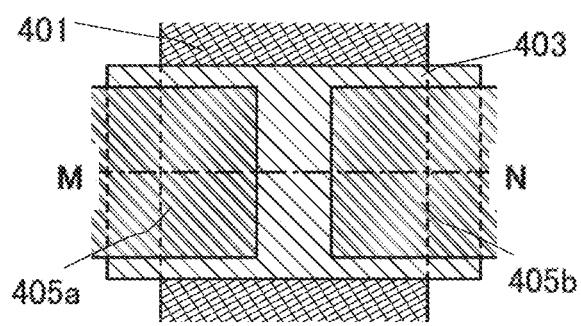

In the plan view of FIG. 4B, the source electrode layer 405*a* and the drain electrode layer 405*b* are provided to cover a periphery of the oxide semiconductor layer 403. However, embodiments of the present invention are not limited thereto; for example, as illustrated in a plan view of FIG. 4C, the source electrode layer 405*a* and the drain electrode layer 405*b* may be provided to expose the periphery of the oxide semiconductor layer 403, in the case of which the exposed portion of the oxide semiconductor layer 403 may be contaminated by an etching gas or the like in an etching for formation of the source electrode layer 405*a* and the drain electrode layer 405*b*. In that case, after the etching for the formation of the source electrode layer 405*a* and the drain electrode layer 405*b*, a plasma treatment (with an $N_2O$ gas or an $O_2$ gas) or cleaning (with water or diluted hydrofluoric acid (at 100 times dilution)) is preferably performed on the exposed portion of the oxide semiconductor layer 403. The structure illustrated in FIG. 3C is the same as that illustrated in FIG. 4B except the pattern shape of the oxide semiconductor layer 403.

In this embodiment, an oxide material represented as being $InM1_XM2_YZn_Z$-based ($0<X\leq1$, $0<Y<1$, $Y<X$ and $0<Z$) is used for the oxide semiconductor layer 403. Specifically, an InGaZrZn oxide film deposited by a sputtering method using a target of In:Ga:Zr:Zn=1:0.95:0.05:1 is used for the oxide semiconductor layer 403.

The use of the oxide material represented as being $InM1_XM2_YZn_Z$-based ($0<X\leq1$, $0<Y<1$, $Y<1$, $Y<X$ and $0<Z$) as the oxide semiconductor layer 403 enables generation of oxygen vacancies in the oxide semiconductor layer 403 to be less. The suppression of generation of oxygen vacancies in the oxide semiconductor layer 403 leads to an increase in the reliability.

This embodiment can be combined with any one of Embodiments 1 to 6 as appropriate.

(Embodiment 8)

A semiconductor device having a display function (also referred to as a display device) can be manufactured using the transistor described in Embodiment 5, 6, or 7. Further, part or all of the driver circuitry which includes the transistor can be formed over a substrate where a pixel portion is formed, whereby a system-on-panel can be formed.

Figure 5A:
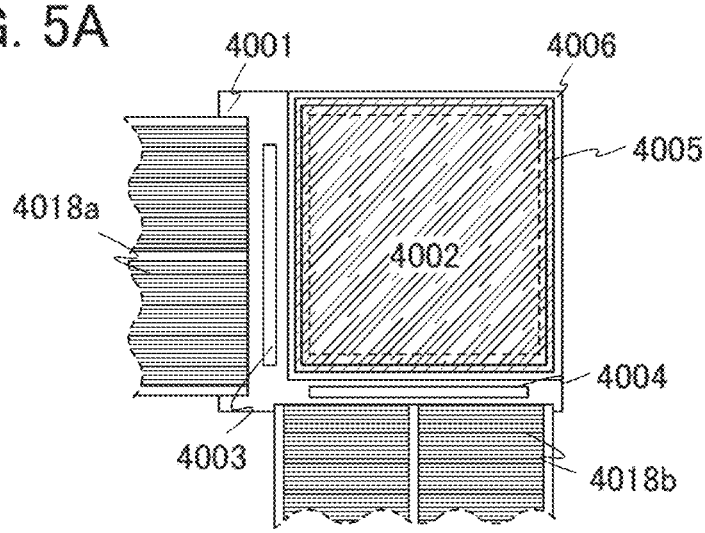
FIGS. 5A to 5C are plan views each illustrating one embodiment of a semiconductor device.

In FIG. 5A, a sealant 4005 is provided so as to surround a pixel portion 4002 provided over a first substrate 4001, and the pixel portion 4002 is sealed with a second substrate 4006. In FIG. 5A, a scan line driver circuit 4004 and a signal line driver circuit 4003 which are each formed using a single crystal semiconductor film or a polycrystalline semiconductor film over a substrate separately prepared are mounted in a region that is different from the region surrounded by the sealant 4005 over the first substrate 4001. A variety of signals and potentials are supplied to the signal line driver circuit 4003, the scan line driver circuit 4004, and the pixel portion 4002 from flexible printed circuits (FPCs) 4018*a* and 4018*b*.

Figure 5B:
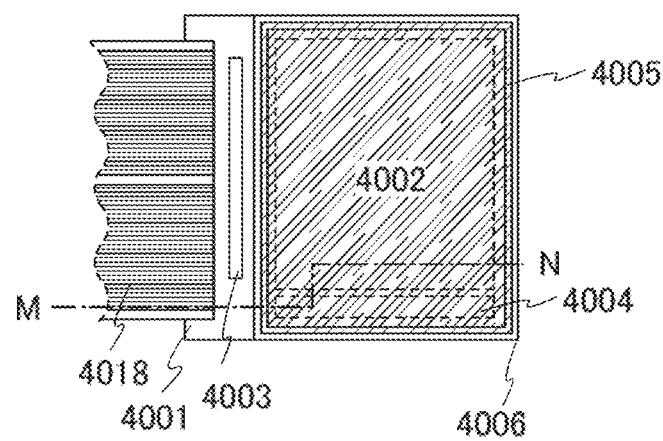
Figure 5C:
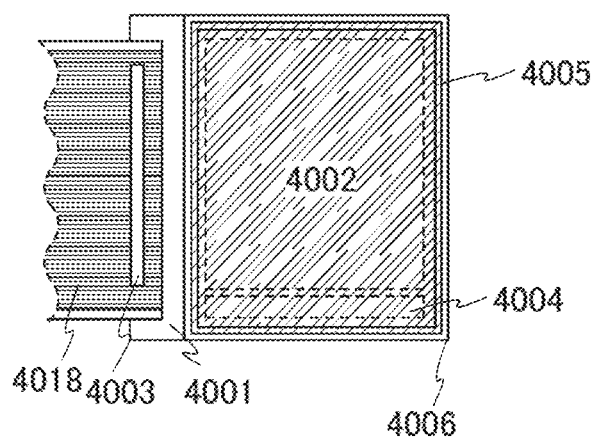

In FIGS. 5B and 5C, a sealant 4005 is provided so as to surround a pixel portion 4002 and a scan line driver circuit 4004 which are provided over a first substrate 4001. A second substrate 4006 is provided over the pixel portion 4002 and the scan line driver circuit 4004. Consequently, the pixel portion 4002 and the scan line driver circuit 4004 are sealed together with a display element by the first substrate 4001, the sealant 4005, and the second substrate 4006. In FIGS. 5B and 5C, a signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 5B and 5C, a variety of signals and potentials are supplied to the signal line driver circuit 4003, the scan line driver circuit 4004, and the pixel portion 4002 from an FPC 4018.

Although FIGS. 5B and 5C each illustrate an example in which the signal line driver circuit 4003 is formed separately and mounted on the first substrate 4001, embodiments of the present invention are not limited to this structure. The scan line driver circuit may be formed separately and then mounted, or only part of the signal line driver circuit or part of the scan line driver circuit may be formed separately and then mounted.

There is no particular limitation on the connection method of a separately formed driver circuit; a chip on glass (COG) method, a wire bonding method, a tape automated bonding (TAB) method, or the like can be used. FIG. 5A illustrates an example in which the signal line driver circuit 4003 and the scan line driver circuit 4004 are mounted by a COG method. FIG. 5B illustrates an example in which the signal line driver circuit 4003 is mounted by a COG method. FIG. 5C illustrates an example in which the signal line driver circuit 4003 is mounted by a TAB method.

The display device includes, in its category, a panel in which a display element is sealed, and a module in which an IC including a controller or the like is mounted on the panel.

The "display device" in this specification means an image display device, a display device, or a light source (including a lighting device). Further, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in Embodiment 5, 6, or 7 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Further, a display medium whose contrast is changed by an electric effect, such as electronic ink, can be used.

One embodiment of the semiconductor device is described with reference to FIGS. 5A to 5C, FIGS. 6A and 6B, and FIGS. 7A and 7B. FIGS. 7A and 7B correspond to cross-sectional views taken along line M-N in FIG. 5B.

As illustrated in FIGS. 5A to 5C and FIGS. 7A and 7B, the semiconductor device includes a connection terminal electrode 4015 and a terminal electrode 4016. The connection terminal electrode 4015 and the terminal electrode 4016 are electrically connected to a terminal included in the FPC 4018, 4018b through an anisotropic conductive film 4019.

The connection terminal electrode 4015 is formed of the same conductive film as a first electrode layer 4030, and the terminal electrode 4016 is formed of the same conductive film as gate electrode layers of transistors 4010 and 4011.

The pixel portion 4002 and the scan line driver circuit 4004 which are provided over the first substrate 4001 include a plurality of transistors; in FIGS. 7A and 7B, the transistor 4010 included in the pixel portion 4002 and the transistor 4011 included in the scan line driver circuit 4004 are shown. In FIG. 7A, an insulating film 4020 is provided over the transistors 4010 and 4011, and in FIG. 7B, an insulating film 4021 is further provided. An insulating film 4023 is an insulating film serving as a base film.

The transistor described in Embodiment 5, 6, or 7 can be applied to the transistor 4010 and the transistor 4011. In this embodiment, an example in which a transistor having a structure similar to that of the transistor 425 described in Embodiment 6 is applied is described. The transistors 4010 and 4011 are bottom-gate transistors in each of which an insulating layer functioning as a channel protective film is provided over an oxide semiconductor film.

In the transistors 4010 and 4011 each having a structure similar to that of the transistor 425 described in Embodiment 6, an oxide material represented as being $InM1_xM2_yZn_z$-based ($0<X\leq1$, $0<Y<1$, $Y<X$, and $0<Z$) is used as the oxide semiconductor layer, whereby generation of oxygen vacancies in the oxide semiconductor layer can be suppressed. The suppression of generation of oxygen vacancies in the oxide semiconductor layer leads to an increase in the reliability.

Alternatively, a structure similar to that of the transistor 424 described in Embodiment 5 may be applied to the transistors 4010 and 4011.

A conductive layer may be further provided so as to overlap with the channel formation region in the oxide semiconductor film of the transistor 4011 for the driver circuit. By providing the conductive layer so as to overlap with the channel formation region in the oxide semiconductor film, a change in the threshold voltage of the transistor 4011 between before and after a bias-temperature stress test (BT test) can be further reduced. The potential of the conductive layer is either the same as or different from that of the gate electrode layer of the transistor 4011, and can function as a second gate electrode layer.

The conductive layer also has a function of blocking an external electric field, that is, a function of preventing an external electric field (particularly, a function of preventing static electricity) from affecting the inside (circuit portion including a transistor). The blocking function of the conductive layer can prevent fluctuation in the electrical characteristics of the transistor due to an influence of an external electric field such as static electricity.

The transistor 4010 included in the pixel portion 4002 is electrically connected to a display element in a display panel. There is no particular limitation on the kind of display element as long as display can be performed; any kind of display element can be used.

An example of a liquid crystal display device using a liquid crystal element as a display element is illustrated in FIG. 7A. In FIG. 7A, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 are stacked with the liquid crystal layer 4008 provided therebetween.

A spacer 4035 is a columnar spacer which is obtained by selective etching of an insulating film, and is provided in order to control the thickness of the liquid crystal layer 4008 (cell gap). A spherical spacer may alternatively be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In that case, the liquid crystal layer 4008 is in contact with the first electrode layer 4030 and the second electrode layer 4031. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor using an oxide semiconductor film has a possibility that the electric characteristics of the transistor may fluctuate significantly by the influence of static electricity and deviate from the designed range. Thus, it is more effective to use a liquid crystal composition exhibiting a blue phase for the liquid crystal display device including the transistor using an oxide semiconductor film.

The specific resistivity of the liquid crystal material is higher than or equal to $1\times10^9$ Ω·cm, preferably higher than or equal to $1\times10^{11}$ Ω·cm, further preferably higher than or equal to $1\times10^{12}$ Ω·cm. The specific resistivity in this specification is measured at 20° C.

The size of a storage capacitor in the liquid crystal display device is set considering the leakage current of the transistor provided in the pixel portion or the like so that charge can be held for a predetermined period. The size of the storage capacitor may be set considering the off-state current of the transistor or the like.

For the liquid crystal display device, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. This embodiment can also be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied to the display device. It is also possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be provided by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel for color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. The sizes of display regions may differ between respective dots of color elements. Embodiments of the present invention disclosed herein are not limited to the application to a display device for color display; one embodiment of the present invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an example in which an organic EL element is used as a light-emitting element is described.

To extract light from the light-emitting element, at least one of the pair of electrodes has a light-transmitting property. A transistor and the light-emitting element are formed over a substrate. The light-emitting element can have any of the following structures: a top emission structure in which light emission is extracted through a surface opposite to the substrate; a bottom emission structure in which light emission is extracted through a surface on the substrate side; and a dual emission structure in which light emission is extracted through the surface opposite to the substrate and the surface on the substrate side.

Figure 6A:
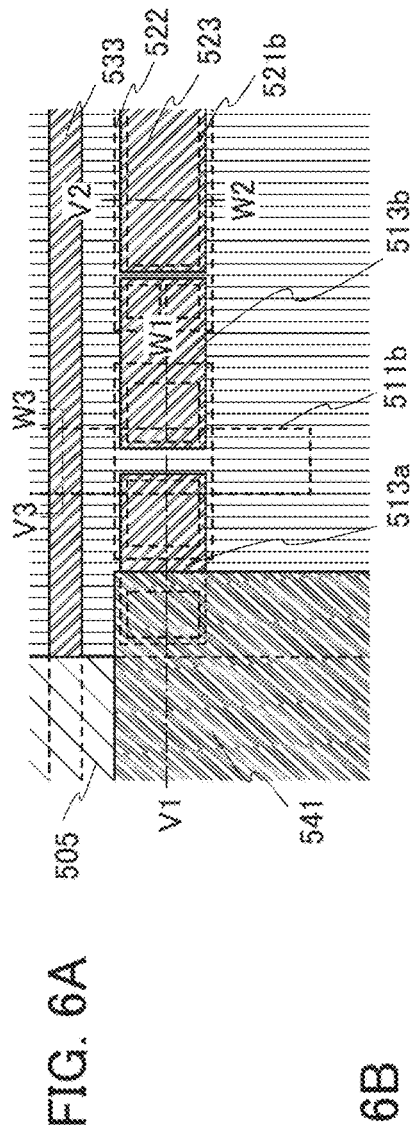
FIGS. 6A and 6B are a plan view and a cross-sectional view illustrating one embodiment of a semiconductor device.
Figure 6B:
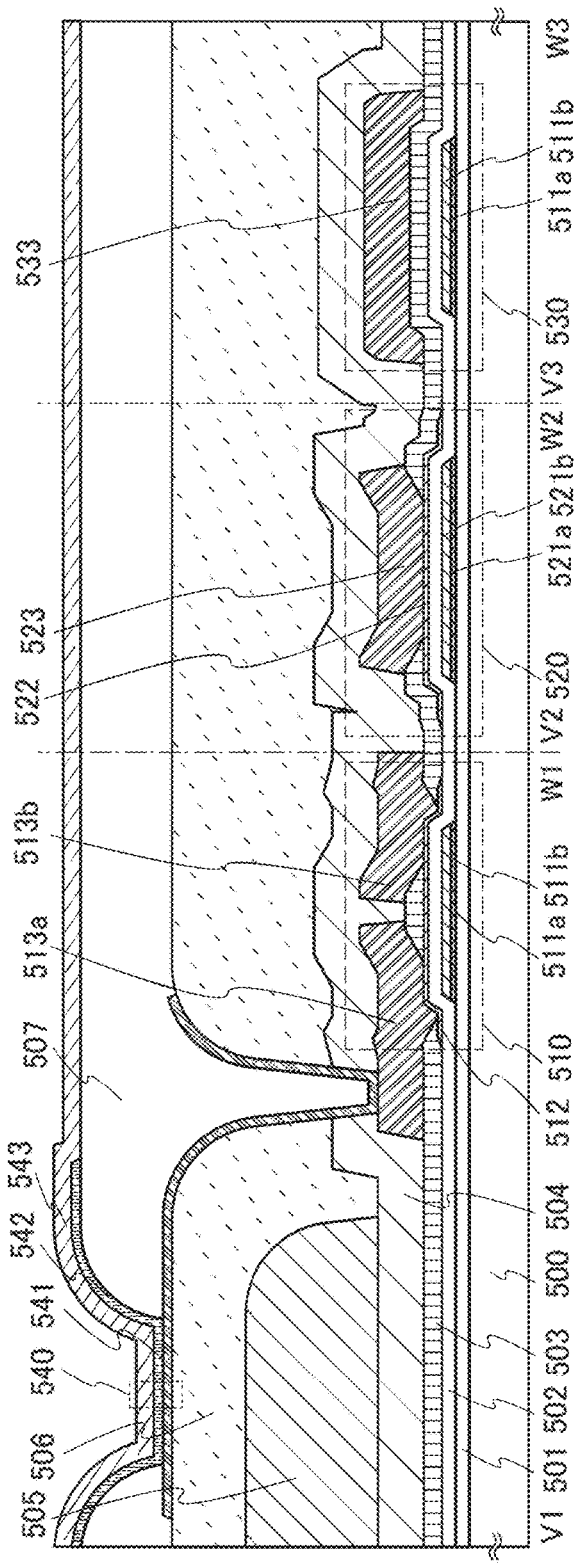
Figure 7A:
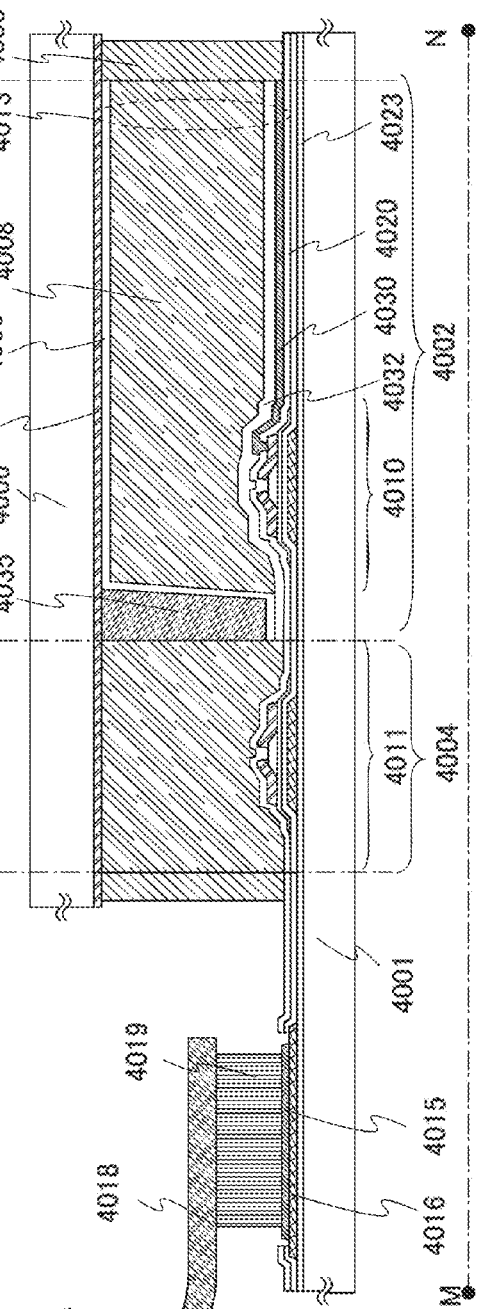
FIGS. 7A and 7B are cross-sectional views each illustrating one embodiment of a semiconductor device.
Figure 7B:
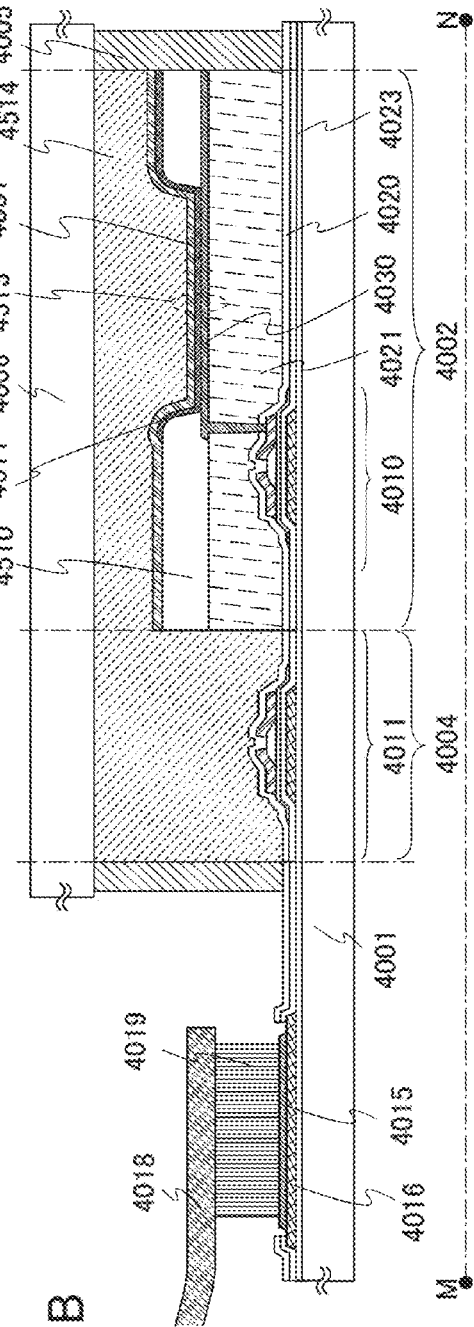

FIGS. 6A and 6B and FIG. 7B illustrate examples of a light-emitting device using a light-emitting element as a display element.

FIG. 6A is a plan view of a light-emitting device and FIG. 6B is a cross-sectional view taken along dashed-dotted lines V1-W1, V2-W2, and V3-W3 in FIG. 6A. An electroluminescent layer 542 and a second electrode layer 543 are not illustrated in the plan view in FIG. 6A.

The light-emitting device illustrated in FIGS. 6A and 6B includes, over a substrate 500 provided with an insulating film 501 functioning as a base film, a transistor 510, a capacitor 520, and an intersection 530 of wiring layers. The transistor 510 is electrically connected to a light-emitting element 540. FIGS. 6A and 6B illustrate a bottom-emission light-emitting device in which light from the light-emitting element 540 is extracted through the substrate 500.

The transistor described in Embodiment 5, 6, or 7 can be applied to the transistor 510. In this embodiment, an example in which a transistor having a structure similar to that of the transistor 424 described in Embodiment 5 is used is described. The transistor 510 is an inversed staggered transistor with a bottom-gate structure, in which an insulating layer functioning as a channel protective film is provided over an oxide semiconductor layer.

The transistor 510 includes gate electrode layers 511a and 511b, a gate insulating layer 502, an oxide semiconductor layer 512, an insulating layer 503, and conductive layers 513a and 513b functioning as a source electrode layer and a drain electrode layer.

In the transistor 510 having a structure similar to that of the transistor 424 described in Embodiment 5, the insulating layer 503 functioning as a channel protective film is provided over the oxide semiconductor layer 512 including at least a channel formation region, which overlaps with the gate electrode layers 511a and 511b, and has an opening which reaches the oxide semiconductor layer 512 and whose inner wall is covered with the conductive layer 513a or 513b functioning as a source electrode layer or a drain electrode layer.

Alternatively, a structure similar to that of the transistor 425 described in Embodiment 6 may be applied to the transistor 510.

Thus, a highly reliable semiconductor device can be provided as the semiconductor device, illustrated in FIGS. 6A and 6B, which includes the transistor 510 of this embodiment using the oxide semiconductor layer 512 and having stable electric characteristics. Further, such a highly reliable semiconductor device can be manufactured with a high yield, so that high productivity can be achieved.

The capacitor 520 includes conductive layers 521a and 521b, the gate insulating layer 502, an oxide semiconductor layer 522, and a conductive layer 523. The gate insulating layer 502 and the oxide semiconductor layer 522 are sandwiched between the conductive layer 523 and the conductive layers 521a and 521b, whereby the capacitor is formed.

The intersection 530 of wiring layers is an intersection of a conductive layer 533 and the gate electrode layers 511a and 511b. The conductive layer 533 and the gate electrode layers 511a and 511b intersect with each other with the gate insulating layer 502 and the insulating layer 503 provided therebetween. In the structure described in Embodiment 4, not only the gate insulating layer 502 but also the insulating layer 503 can be provided between the conductive layer 533 and the gate electrode layers 511a and 511b at the intersection 530 of wiring layers; thus, parasitic capacitance between the conductive layer 533 and the gate electrode layers 511a and 511b can be reduced.

In this embodiment, a 30-nm-thick titanium film is used as each of the gate electrode layer 511a and the conductive layer 521a, and a 200-nm-thick copper thin film is used as each of the gate electrode layer 511b and the conductive layer 521b. Thus, the gate electrode layer has a stacked-layer structure of a titanium film and a copper thin film.

As the oxide semiconductor layer 512, 522, a 25-nm-thick InGaTiZn oxide film is formed by a sputtering method using a target of In:Ga:Ti:Zn=1:0.95:0.05:1.

An interlayer insulating film 504 is formed over the transistor 510, the capacitor 520, and the intersection 530 of wiring layers. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a stacked-layer structure in which a first electrode layer 541, the electroluminescent layer 542, and the second electrode layer 543 are stacked in that order is provided over the insulating film 506. The first electrode layer 541 is in contact with the conductive layer 513a in an opening formed in the insulating film 506 and the interlayer insulating film 504, which reaches the conductive layer 513a, whereby the light-emitting element 540 is electrically connected to the transistor 510. A bank 507 is provided so as to cover part of the first electrode layer 541 and the opening.

As the interlayer insulating film 504, a silicon oxynitride film having a thickness greater than or equal to 200 nm and less than or equal to 600 nm, which is formed by a plasma-enhanced CVD method can be used. Further, a photosensitive acrylic film having a thickness of 1500 nm and a photosensitive polyimide film having a thickness of 1500 nm can be used as the insulating film 506 and the bank 507, respectively.

As the color filter layer 505, for example, a chromatic light-transmitting resin can be used. As such a chromatic light-transmitting resin, a photosensitive organic resin or a nonphotosensitive organic resin can be used. A photosensitive organic resin layer is preferably used, because the number of resist masks can be reduced, leading to simplification of a process.

Chromatic colors are colors except achromatic colors such as black, gray, and white. The color filter layer is formed using a material which transmits only light of the chromatic color. As the chromatic color, red, green, blue, or the like can be used. Cyan, magenta, yellow, or the like may also be used. Meaning of "which transmits only light of the chromatic color" is that the light transmitted through the color filter layer has a peak at a wavelength of light of the chromatic color. The thickness of the color filter layer may be controlled to be optimal as appropriate in consideration of the relationship between the concentration of a coloring material to be contained and the transmittance of light. For example, the color filter layer 505 may have a thickness greater than or equal to 1500 nm and less than or equal to 2000 nm.

In the light-emitting device illustrated in FIG. 7B, a light-emitting element 4513 which is a display element is electrically connected to the transistor 4010 provided in the pixel portion 4002. A structure of the light-emitting element 4513 is not limited to the shown stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A bank 4510 and the bank 507 can be formed using an organic insulating material or an inorganic insulating material. It is particularly preferable that the bank 4030, 541 be formed using a photosensitive resin material to have an opening over the first electrode layer 4030, 541 such that the sidewall of the opening is a tilted surface with continuous curvature.

The electroluminescent layer 4511, 542 is formed of either a single layer or a plurality of layers stacked.

A protective film may be formed over the second electrode layer 4031, 543 and the bank 4510, 507 in order to prevent entry of oxygen, hydrogen, moisture, carbon dioxide, or the like into the light-emitting element 4513, 540. As the protective film, a silicon nitride film, a silicon nitride oxide film, a DLC film, or the like can be formed.

Further, the light-emitting element 4513, 540 may be covered with a layer containing an organic compound deposited by an evaporation method in order to prevent entry of oxygen, hydrogen, moisture, carbon dioxide, or the like into the light-emitting element 4513, 540.

In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and/or depressions on the surface so as to reduce the glare can be performed.

In FIGS. 5A to 5C, FIGS. 6A and 6B, and FIGS. 7A and 7B, a flexible substrate as well as a glass substrate can be used as any of the first substrates 4001 and 500 and the second substrate 4006. For example, a plastic substrate having a light-transmitting property or the like can be used. As the plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is sandwiched between PVF films or polyester films can be used.

In this embodiment, an aluminum oxide film is used as the insulating film 4020. The insulating film 4020 can be formed by a sputtering method or a plasma-enhanced CVD method.

The aluminum oxide film provided as the insulating film 4020 over the oxide semiconductor layer has a high shielding effect (blocking effect) of preventing penetration of both oxygen and impurities such as hydrogen and moisture.

Therefore, in and after the manufacturing process, the aluminum oxide film functions as a protective film for preventing entry of impurities such as hydrogen and moisture, which cause a change in characteristics, into the oxide semiconductor layer and release of oxygen, which is a main component material of the oxide semiconductor, from the oxide semiconductor layer.

The insulating film 4021, 506 serving as a planarization insulating film can be formed using an organic material having heat resistance, such as an acrylic-resin, polyimide-resin, or benzocyclobutene-based resin, polyamide resin, or epoxy resin. Other than such organic materials, it is also possible to use a low-dielectric constant material (low-k material), a siloxane-based resin, phosphosilicate glass (PSG), borophosphosilicate glass (BPSG), or the like. The insulating film may be formed by stacking a plurality of insulating films formed using any of these materials.

There is no particular limitation on the method of forming the insulating film 4021, 506; the following method can be used depending on the material: a sputtering method, an SOG method, spin coating, dipping, spray coating, a droplet discharge method (an inkjet method), a printing method (such as screen printing or offset printing), or the like.

The display device displays an image with light transmitted from a light source or a display element. Thus, the substrate and the thin films such as the insulating film and the conductive film provided for the pixel portion where light is transmitted have light-transmitting properties with respect to light in the visible light wavelength range.

The first electrode layer and the second electrode layer (also referred to as a pixel electrode layer, a common electrode layer, a counter electrode layer, or the like) for applying voltage to the display element is provided with light-transmitting properties or light-reflecting properties, which depends on the direction in which light is extracted, the position where the electrode layer is provided, and the pattern structure of the electrode layer.

The first electrode layer 4030, 541 and the second electrode layer 4031, 543 can be formed using a light-transmitting conductive material such as an indium oxide containing a tungsten oxide, an indium zinc oxide containing a tungsten oxide, an indium oxide containing a titanium oxide, an indium tin oxide containing a titanium oxide, an indium tin oxide (hereinafter referred to as ITO), an indium zinc oxide, an indium tin oxide to which a silicon oxide is added, or graphene.

The first electrode layer 4030, 541 and the second electrode layer 4031, 543 can be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy thereof; and a nitride thereof.

In this embodiment, since the light-emitting device illustrated in FIGS. 6A and 6B is the bottom-emission type, the first electrode layer 541 has a light-transmitting property and the second electrode layer 543 has a light-reflecting property. Accordingly, in the case of using a metal film as the first electrode layer 541, the film is preferably thin enough to keep the light-transmitting property; on the other hand, in the case of using a light-transmissive conductive film as the second electrode layer 543, a conductive film having a light-reflecting property is preferably stacked thereon.

A conductive composition containing a conductive high molecule (also referred to as a conductive polymer) can be used for the first electrode layer 4030, 541 and the second electrode layer 4031, 543. As the conductive high molecule, a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken by static electricity or the like, a protection circuit for protecting the driver circuit is preferably provided. The protection circuit is preferably formed using a nonlinear element.

As described above, by using the transistor described in Embodiment 5, 6, or 7, a semiconductor device having a variety of functions can be provided.

The structures, methods, and the like described in this embodiment can be combined as appropriate with any of the structures, methods, and the like described in the other embodiments.

(Embodiment 9)

In this embodiment, an example of a semiconductor device which uses the transistor described in this specification and can retain stored data even during a period in which power is not supplied, and whose number of write cycles is not limited is described with reference to drawings.

Figure 8A:
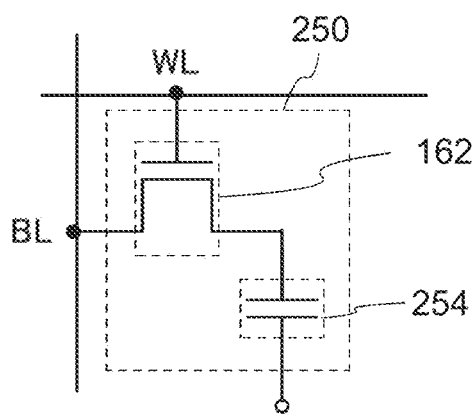
FIGS. 8A and 8B are a circuit diagram and a perspective view illustrating one embodiment of a semiconductor device.
Figure 8B:
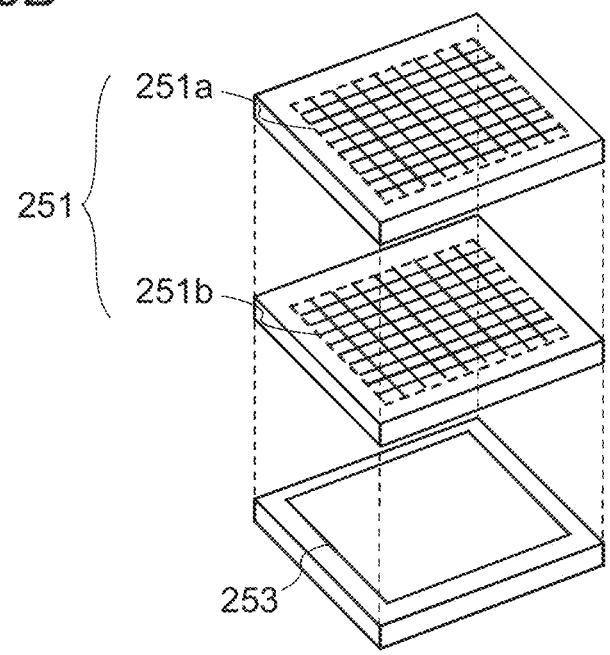

FIG. 8A illustrates an example of a circuit configuration of a semiconductor device, and FIG. 8B is a conceptual diagram illustrating an example of a semiconductor device. First, the semiconductor device illustrated in FIG. 8A is described, and then, the semiconductor device illustrated in FIG. 8B is described below.

In the semiconductor device illustrated in FIG. 8A, a bit line BL is electrically connected to a source electrode or a drain electrode of a transistor 162, a word line WL is electrically connected to a gate electrode of the transistor 162, and the source electrode or the drain electrode of the transistor 162 is electrically connected to a first terminal of a capacitor 254.

Next, writing and holding of data in the semiconductor device (a memory cell 250) illustrated in FIG. 8A are described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Accordingly, the potential at the first terminal of the capacitor 254 is held (holding).

The transistor 162 using an oxide semiconductor has a feature of extremely small off-state current, though depending on the material. Therefore, in the case where an oxide semiconductor material for extremely small off-state current, the potential of the first terminal of the capacitor 254 (or a charge accumulated in the capacitor 254) can be retained for an extremely long period by turning off the transistor 162.

Next, reading of data is described. The transistor 162 is turned on, so that the bit line BL being in a floating state is electrically connected to the capacitor 254, whereby the charge is redistributed between the bit line BL and the capacitor 254. As a result, the potential of the bit line BL is changed. The change in potential of the bit line BL varies depending on the potential of the first terminal of the capacitor 254 (or the charge accumulated in the capacitor 254).

For example, the potential of the bit line BL after charge redistribution is (CB×VB0+C×V)/(CB+C), where V is the potential of the first terminal of the capacitor 254, C is the capacitance of the capacitor 254, CB is the capacitance of the bit line BL (hereinafter also referred to as bit line capacitance), and VB0 is the potential of the bit line BL before the charge redistribution. Therefore, it can be found that assuming that the memory cell 250 is in either of two states in which the potentials of the first terminal of the capacitor 254 are V1 and V0 (V1>V0), the potential of the bit line BL in the case of holding the potential V1 (=(CB×VB0+C×V1)/(CB+C)) is higher than the potential of the bit line BL in the case of holding the potential V0 (=(CB×VB0+C×V0)/(CB+C)).

Then, by comparing the potential of the bit line BL with a predetermined potential, data can be read.

In this manner, the semiconductor device illustrated in FIG. 8A can retain charge accumulated in the capacitor 254 for a long time in the case where an oxide semiconductor material for extremely small off-state current of the transistor 162 is used for a channel formation region of the transistor 162. In other words, refresh operation can be made unnecessary or the frequency of refresh operation can be made extremely low, whereby power consumption can be sufficiently reduced. Further, stored data can be retained for a long time even in a period during which power is not supplied.

Next, the semiconductor device illustrated in FIG. 8B is described.

The semiconductor device illustrated in FIG. 8B includes a memory cell array 251 (memory cell arrays 251a and 251b) each including the plurality of memory cells 250 illustrated in FIG. 8A as memory circuits in the upper portion, and a peripheral circuit 253 in the lower portion which is necessary for operating the memory cell array 251 (memory cell arrays 251a and 251b). The peripheral circuit 253 is electrically connected to the memory cell array 251.

In the structure illustrated in FIG. 8B, the peripheral circuit 253 can be provided under the memory cell array 251 (memory cell arrays 251a and 251b), whereby the size of the semiconductor device can be decreased.

It is preferable that a semiconductor material of a transistor in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor using such a semiconductor material enables sufficiently high speed operation. Therefore, the transistor enables a variety of circuits (e.g., a logic circuit or a driver circuit) which needs to operate at high speed to be favorably realized.

FIG. 8B illustrates, as an example, the semiconductor device in which two memory cell arrays (the memory cell arrays 251a and 251b) are stacked; however, the number of memory cells to be stacked is not limited thereto. Three or more memory cells may be stacked.

Next, a specific structure of the memory cell 250 illustrated in FIG. 8A is described with reference to FIGS. 9A and 9B.

Figure 9A:
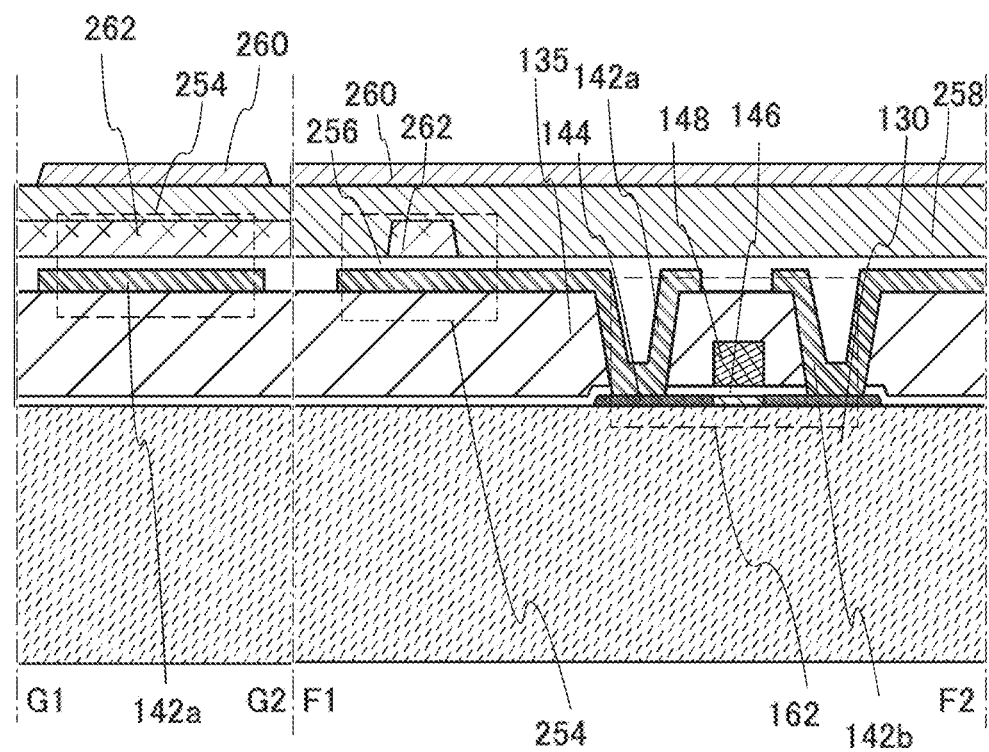
FIGS. 9A and 9B are a cross-sectional view and a plan view illustrating one embodiment of a semiconductor device.
Figure 9B:
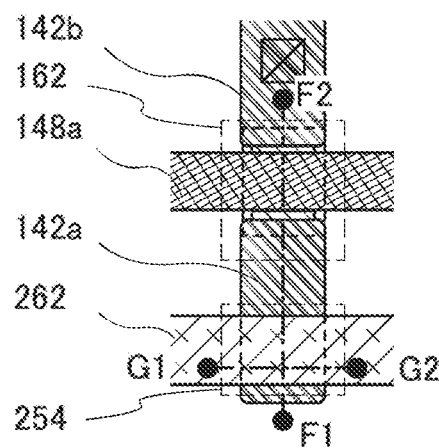

FIGS. 9A and 9B illustrate an example of a structure of the memory cell 250. FIG. 9A illustrates cross sections of the memory cell 250, and FIG. 9B is a plan view of the memory cell 250. FIG. 9A illustrates cross sections taken along line F1-F2 and line G1-G2 in FIG. 9B.

The transistor 162 in FIGS. 9A and 9B can have the same structure as the transistor 420 described in Embodiment 1.

An insulating film 256 which consists of a single layer or a stacked layer is provided over the transistor 162. In addition, a conductive layer 262 is provided in a region overlapping with an electrode layer 142a of the transistor 162 with the insulating film 256 provided therebetween, so that the electrode layer 142a, an insulating layer 135, the insulating film 256, and the conductive layer 262 form the capacitor 254. That is, the electrode layer 142a of the transistor 162 functions as one electrode of the capacitor 254, and the conductive layer 262 functions as the other electrode of the capacitor 254.

An insulating film 258 is provided over the transistor 162 and the capacitor 254. Further, the memory cell 250 and a wiring 260 for connecting the adjacent memory cells 250 are provided over the insulating film 258. Although not shown, the wiring 260 is electrically connected to the electrode layer 142a of the transistor 162 through an opening formed in the insulating film 256, the insulating film 258, and the like. The wiring 260 may be electrically connected to the electrode layer 142a through another conductive layer provided in the opening. The wiring 260 corresponds to the bit line BL in the circuit diagram of FIG. 8A.

In FIGS. 9A and 9B, an electrode layer 142b of the transistor 162 can also function as a source electrode of a transistor included in an adjacent memory cell.

With the planar layout illustrated in FIG. 9A, the area occupied by the semiconductor device can be reduced; thus, higher integration can be achieved.

As described above, the plurality of memory cells formed in multiple layers in the upper portion each use a transistor using an oxide semiconductor. Since the off-state current of the transistor using an oxide semiconductor is small, stored data can be retained for a long time owing to this transistor. In other words, the frequency of refresh operation can be extremely lowered, which leads to a sufficient reduction in power consumption.

In this manner, a semiconductor device having a novel feature can be realized by providing over one substrate, a peripheral circuit using a transistor using a material other than an oxide semiconductor (in other words, a transistor capable of operating at sufficiently high speed) and a memory circuit using a transistor using an oxide semiconductor (in a broader sense, a transistor whose off-state current is sufficiently small). In addition, a structure where the peripheral circuit and the memory circuit are stacked leads to an increase in the degree of integration of the semiconductor device.

As described above, a miniaturized, highly-integrated semiconductor device provided with high electric characteristics and a method for manufacturing the semiconductor device can be provided.

This embodiment can be implemented in appropriate combination with any structure described in the other embodiments.

(Embodiment 10)

A semiconductor device disclosed in this specification can be applied to a variety of electronic devices (including game machines). Examples of the electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic devices are illustrated in FIGS. 10A to 10C.

Figure 10A:
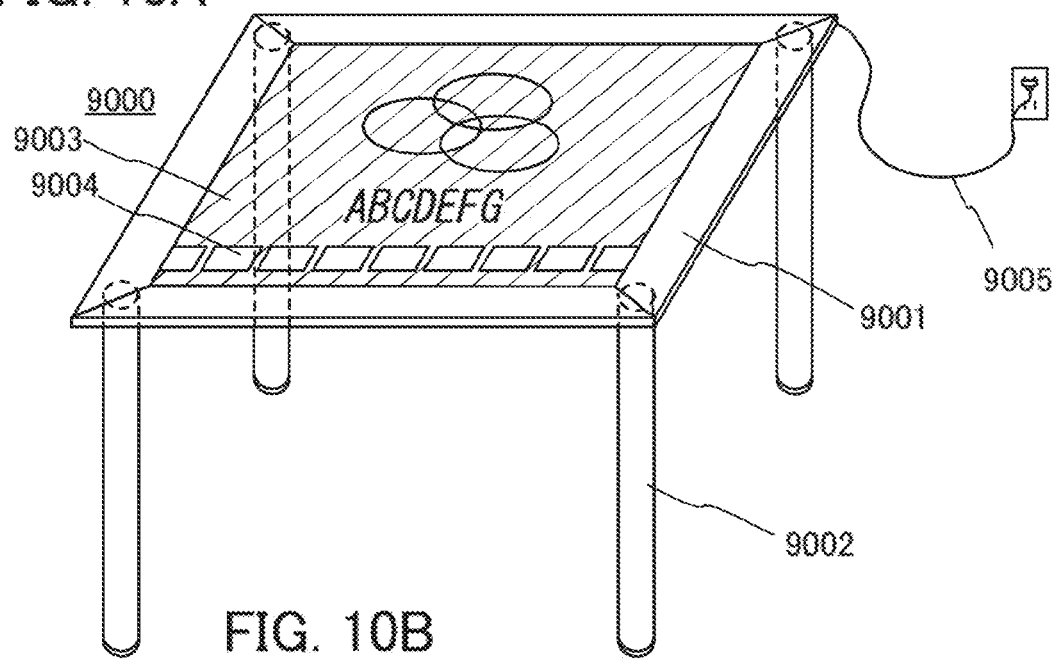
FIGS. 10A to 10C illustrate electronic devices.
Figure 10B:
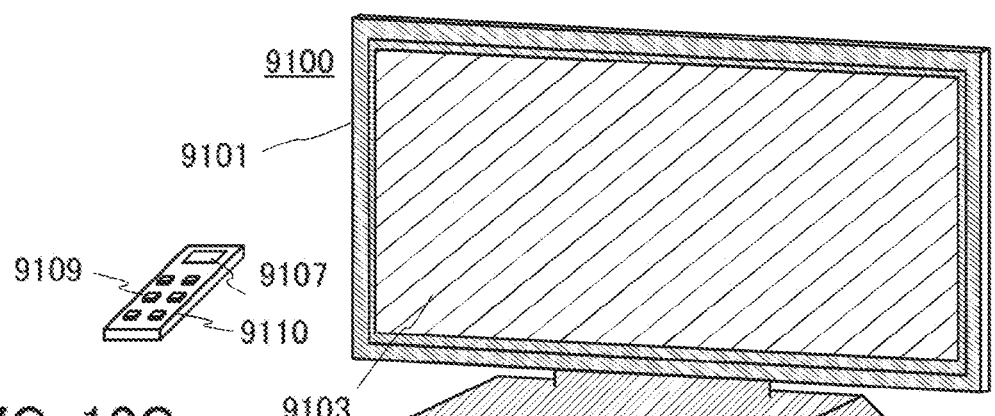
Figure 10C:
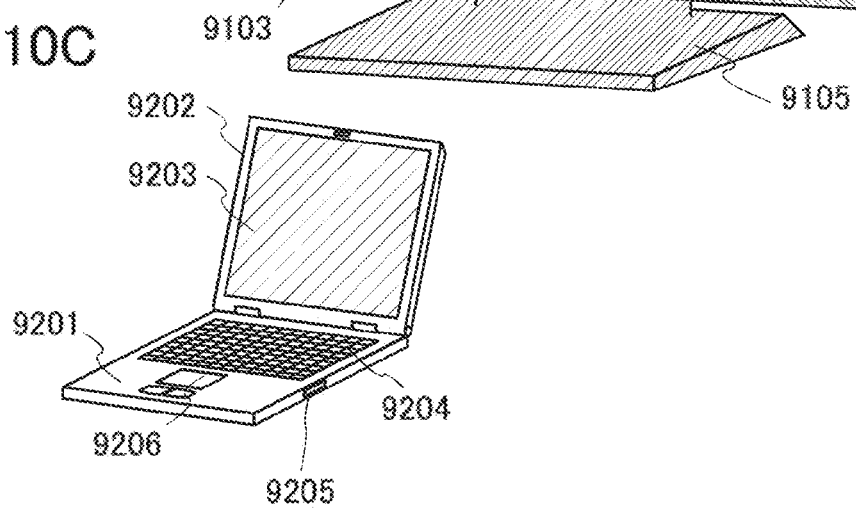

FIG. 10A illustrates a table 9000 having a display portion. In the table 9000, a display portion 9003 is incorporated in a housing 9001 and an image can be displayed on the display portion 9003. The housing 9001 is supported by four leg portions 9002. Further, a power cord 9005 for supplying power is provided for the housing 9001.

The semiconductor device described in any of Embodiments 1 to 8 can be used for the display portion 9003, whereby the electronic device can be provided with high reliability.

The display portion 9003 has a touch-input function. A user can touch displayed buttons 9004 which are displayed on the display portion 9003 of the table 9000 with his/her finger or the like, to carry out screen operation or input information. Further, when the table may be made to communicate with home appliances or control the home appliances, the table 9000 may function as a control device which controls the home appliances by the screen operation. For example, the semiconductor device having an image sensor described in Embodiment 3 can provide the display portion 9003 with a touch input function.

Further, the screen of the display portion 9003 can be placed perpendicular to a floor with a hinge provided for the housing 9001; thus, the table 9000 can also be used as a television device. Although when a television device having a large screen is set in a small room, an open space is reduced accordingly, a display portion incorporated in a table enables a space in the room to be efficiently used.

FIG. 10B illustrates a television set 9100. In the television set 9100, a display portion 9103 is incorporated in a housing 9101 and an image can be displayed on the display portion 9103. The housing 9101 is supported by a stand 9105 in the drawing.

The television set 9100 can be operated with an operation switch provided for the housing 9101 or a separate remote controller 9110. Channels and volume can be controlled with an operation key 9109 provided for the remote controller 9110 so that an image displayed on the display portion 9103 can be controlled. The remote controller 9110 may be provided with a display portion 9107 for displaying data output from the remote controller 9110.

The television set 9100 illustrated in FIG. 10B is provided with a receiver, a modem, and the like. With the receiver, the television set 9100 can receive general TV broadcasts. Further, the television set 9100 can be connected to a communication network with or without wires via the modem, enabling one-way (from sender to receiver) or two-way (between sender and receiver or between receivers) data communication.

The semiconductor device described in any of Embodiments 1 to 8 can be used for the display portions 9103 and 9107, whereby the television set and the remote controller can be provided with high reliability.

FIG. 10C illustrates a computer which includes a main body 9201, a bezel 9202, a display portion 9203, a keyboard 9204, an external connection port 9205, a pointing device 9206, and the like. The computer includes a semiconductor device manufactured according to one embodiment of the present invention for the display portion 9203. The semiconductor device described in the above embodiment can be used, whereby the computer can be provided with high reliability.

Figure 11A:
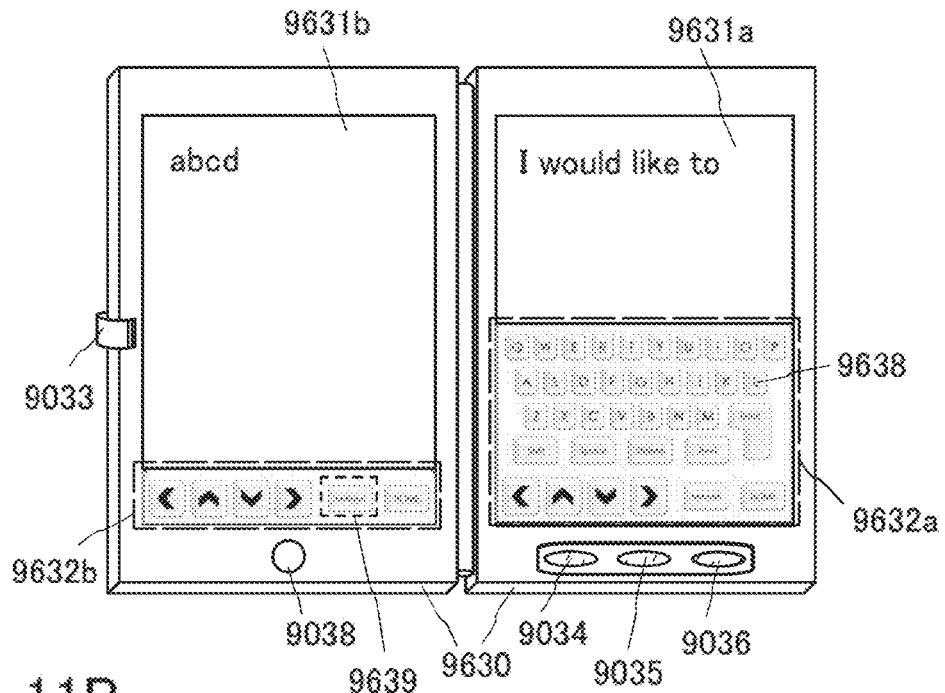
FIGS. 11A to 11C illustrate an electronic device.
Figure 11B:
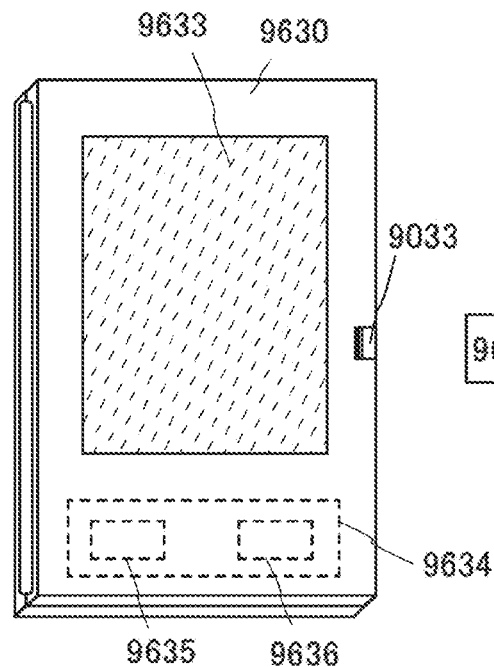

FIGS. 11A and 11B illustrate a tablet terminal that can be folded. FIG. 11A illustrates the tablet terminal which is open. The tablet terminal includes a housing 9630, a display portion 9631a, a display portion 9631b, a switch 9034 for switching display modes, a power switch 9035, a switch 9036 for switching to power-saving mode, a fastener 9033, and an operation switch 9038.

In such a portable device illustrated in FIGS. 11A and 11B, an SRAM or a DRAM is used as a memory element for temporarily storing image data. For example, the semiconductor device described in Embodiment 9 can be used as a memory element. The semiconductor device described in the above embodiment employed for the memory element enables writing and reading of data to be performed at high speed, enables data to be retained for a long time, and enables power consumption to be sufficiently reduced.

The semiconductor device described in any of Embodiments 1 to 8 can be used for the display portion 9631a and the display portion 9631b, whereby the tablet terminal can be provided with high reliability.

A touch panel area 9632a can be provided in a part of the display portion 9631a, in which data can be input by touching displayed operation keys 9638. In the drawing, as an example, one half of the area of the display portion 9631a has only a display function and the other half of the area has a touch panel function; however, embodiments of the present invention are not limited to this structure. All the area of the display portion 9631a may have a touch panel function. For example, all the area of the display portion 9631a can display keyboard buttons and serve as a touch panel while the display portion 9631b can be used as a display screen.

Like the display portion 9631a, a touch panel region 9632b can be formed in part of the display portion 9631b. Further, by touching a button 9639 for switching to keyboard display displayed on the touch panel, keyboard buttons can be displayed on the display portion 9631b.

Further, touch input can be performed concurrently on the touch panel regions 9632a and 9632b.

The display-mode switching button 9034 allows switching between a landscape mode and a portrait mode, color display and black-and-white display, and the like. With the switch 9036 for switching to power-saving mode, the luminance of display can be optimized in accordance with the content of external light at the time when the tablet is in use, which is detected with an optical sensor incorporated in the tablet terminal. The tablet terminal may include another detection device such as a sensor for detecting inclination (e.g., a gyroscope or an acceleration sensor) in addition to the optical sensor.

Although the display portion 9631*a* and the display portion 9631*b* have the same display area in FIG. 11A, embodiments of the present invention are not limited to this structure. The display portion 9631*a* and the display portion 9631*b* may have different areas or different display quality. For example, one of them may be a display panel that can display higher-definition images than the other.

FIG. 11B illustrates the tablet terminal closed, which includes the housing 9630, a solar cell 9633, a charge/discharge control circuit 9634, a battery 9635, and a DCDC converter 9636. FIG. 11B shows an example in which the charge and discharge control circuit 9634 includes the battery 9635 and the DCDC converter 9636.

Since the tablet terminal can be folded in two, the housing 9630 can be closed when the tablet terminal is not in use. Thus, the display portions 9631*a* and 9631*b* can be protected, thereby providing the tablet terminal with high endurance and high reliability for long-term use.

The tablet terminal illustrated in FIGS. 11A and 11B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached on the surface of the tablet terminal, supplies electric power to a touch panel, a display portion, an image signal processor, and the like. Provision of the solar battery 9633 is preferable in that the battery 9635 can be charged efficiently for one or two surfaces of the housing 9630. A lithium ion battery can be used as the battery 9635, leading to an advantage of downsizing or the like.

Figure 11C:
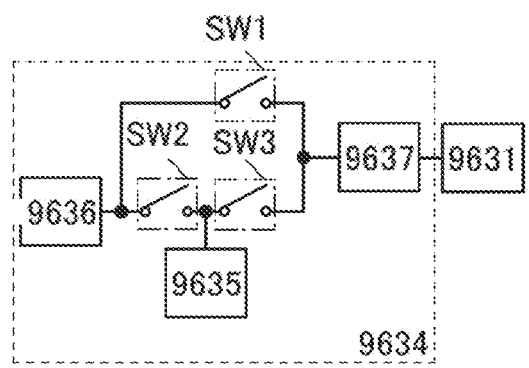

The structure and the operation of the charge/discharge control circuit 9634 illustrated in FIG. 11B are described with reference to a block diagram of FIG. 11C. The solar cell 9633, the battery 9635, the DCDC converter 9636, a converter 9637, switches SW1 to SW3, and the display portion 9631 are illustrated in FIG. 11C, and the battery 9635, the DCDC converter 9636, the converter 9637, and the switches SW1 to SW3 correspond to the charge/discharge control circuit 9634 illustrated in FIG. 11B.

First, an example of operation in the case where power is generated by the solar battery 9633 using external light is described. The voltage of power generated by the solar battery is raised or lowered by the DCDC converter 9636 to a voltage needed for charging the battery 9635. Further, when the display portion 9631 is operated with the power from the solar battery 9633, the switch SW1 is turned on and the voltage of the power is raised or lowered by the converter 9637 to a voltage needed for operating the display portion 9631. When display on the display portion 9631 is not performed, the switch SW1 may be turned off and the switch SW2 may be turned on so that the battery 9635 is charged.

Here, the solar battery 9633 is described as an example of a power generation means; however, there is no particular limitation on a way of charging the battery 9635, and the battery 9635 may be charged with any other power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

The structures, methods, and the like described in this embodiment can be combined as appropriate with any of the structures, methods, and the like described in the other embodiments.

Example 1

Figure 12A:
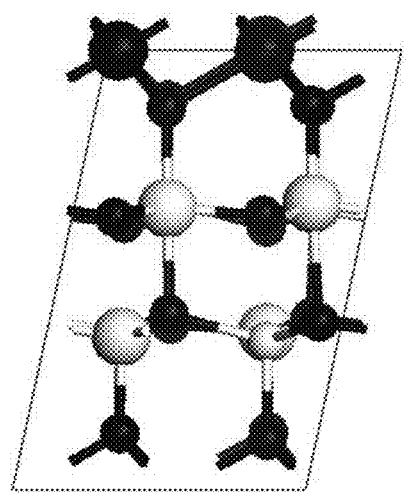
FIG. 12A is a model of a crystal structure before addition of excess oxygen.

In this example, calculation was performed on the basis of a crystal structure shown in FIG. 12A. The crystal structure shown in FIG. 12A is of IGZO (111), a model thereof in which one or more of Ga atoms in the crystal structure shown in FIG. 12A was/were replaced with one or more of Ti atoms, i.e., a model of $InGa_XTi_YZnO_4$ (Y=1−X, Y<X), was made, and the ability of Ti of capturing excess oxygen was calculated. The excess oxygen was disposed near Ga or Ti for the calculation. Here, IGZO (111) means an oxide material of In:Ga:Zn=1:1:1.

In $InGa_XTi_YZnO_4$ representing the model in which one of four Ga atoms is replaced with one Ti atom in FIG. 12A, X is 0.75 and Y is 0.25.

To evaluate the excess oxygen capturing ability of $InGa_XTi_YZnO_4$, the amount of energy change by entrance of excess oxygen, $E_{Oint}$, was calculated. Note that $E_{Oint}$ is obtained by the following formula: $E(InGa_XTi_YZnO_4)+E(O_2)/2−E(InGa_XTi_YZnO_4+O)$. For reference, the amount of energy change $E_{Oint}$ of IGZO containing no Ti was also calculated.

First principle calculation software "CASTEP" was used with the following calculation conditions: the number of atoms is 28 atoms; the basis function is a plane-wave basis; the functional is GGA/PBE; the cut-off energy is 300 eV; and the k-point sampling is 4×3×2. The structure after addition of excess oxygen and structural optimization is shown in FIG. 12B.

The amount of energy change $E_{Oint}$ of IGZO containing no Ti was −1.98 eV, and $E_{Oint}$ of $InGa_XTi_YZnO_4$ (X=0.75, Y=0.25) containing Ti was −0.5 eV.

It is found that $E_{Oint}$ is smaller and thus the excess oxygen capturing ability is higher in the model containing Ti than in the model containing no Ti, one cause of which is that the number of inherent bonds of a Ti element is one more than that of inherent bonds a Ga element.

Figure 12B:
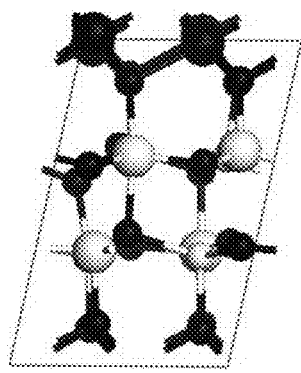
FIG. 12B is a structural model just after the addition of excess oxygen.

Next, whether the above-described structure with excess oxygen, i.e., the structure shown in FIG. 12B, enables an oxygen vacancy in the structure to be compensated was calculated. As the calculation, structural optimization was performed on the structure obtained by removing one oxygen atom bonded to three In atoms and one Ti atom from the structure shown in FIG. 12B. The structure just after the removal of one oxygen atom is shown in FIG. 13B, and the structure after the structural optimization is shown in FIG. 13C.

Figure 13A:
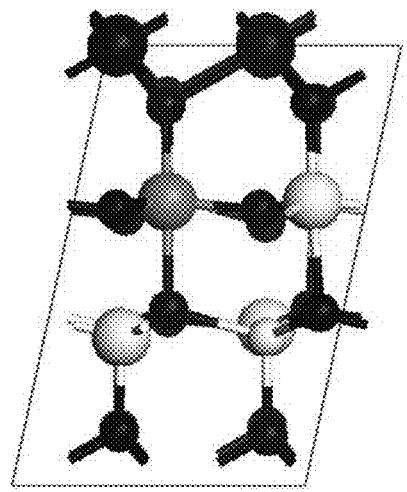
FIG. 13A is a model of a crystal structure after addition of excess oxygen.
Figure 13B:
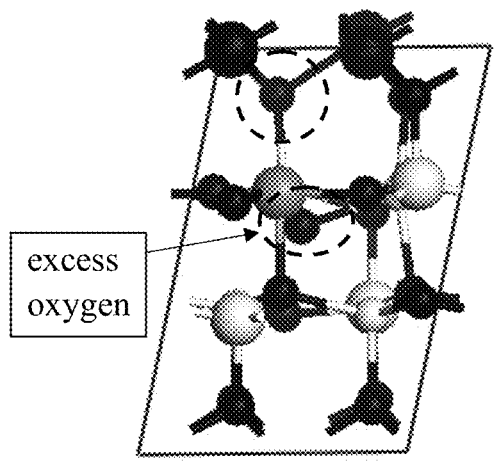
FIG. 13B is a structural model just after removal of one oxygen atom.
Figure 13C:
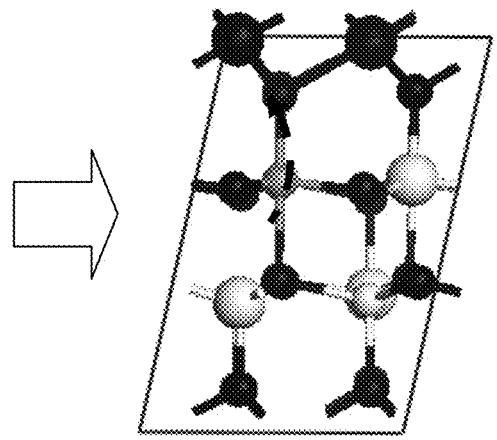
FIG. 13C is a model of the crystal structure after structural optimization after the removal of one oxygen atom.

The above calculation revealed that in $InGa_XTi_YZnO_4$ (X=0.75) with excess oxygen shown in FIG. 13B, oxygen moves to compensate the oxygen vacancy, thereby stabilizing the structure to be the structure shown in FIG. 13C.

Example 2

In this example, how much of X is needed to make $InGa_XTi_YZnO_4$ (Y=1−X, Y<X) an amorphous state was calculated by classical molecular dynamics simulation.

Figure 14:
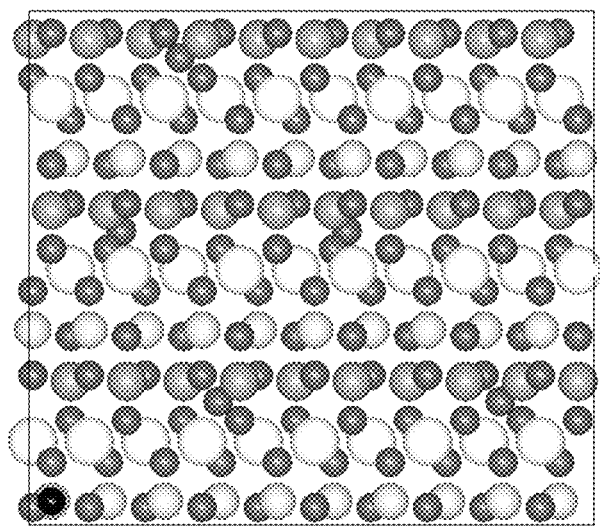
FIG. 14 is a model in which the content of Ti is 0.59 atom %.
Figure 16:
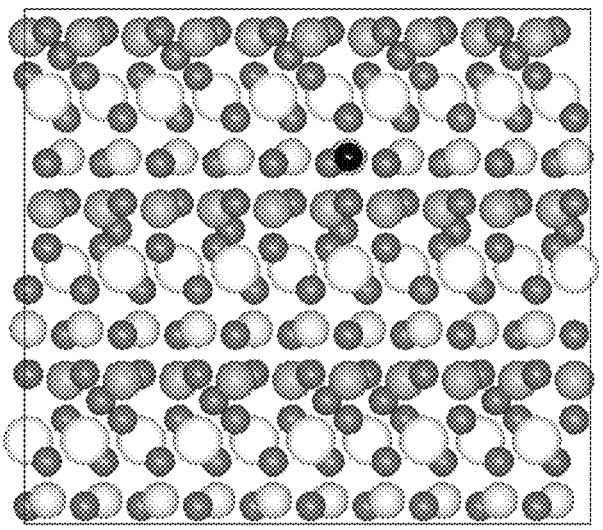
FIG. 16 is a model in which the content of Ti is 1.77 atom %.

First, a single crystal structure of IGZO (111) consisting of 1680 atoms, and a structure obtained by replacing one or more of Ga atoms with one or more of Ti atoms in IGZO (111) consisting of 1680 atoms and disposing excess oxygen near Ti were made. Here, the model where the content of Ti is 0.59 atom % (Y=0.041) (FIG. 14) and the model where the content of Ti is 1.77 atom % (Y=0.125) (FIG. 16) were made. In this example, the "atom %" means atom % relative to the number of all of the atoms. For example, "the content of Ti is 1.77 atom %" is about the number of Ti atoms relative to the number of all of the atoms of IGZO containing Ti.

Next, structural relaxation was performed thereon by classical molecular dynamics simulation at 2,000K with 1 atm for 50 psec. Then, the radial distribution functions g(r) of these structures were calculated.

The radial distribution function g(r) is a function representing the probability density of atoms existing at a distance of r from one atom. As the correlation between atoms weakens, g(r) gets closer to 1.

Figure 15:
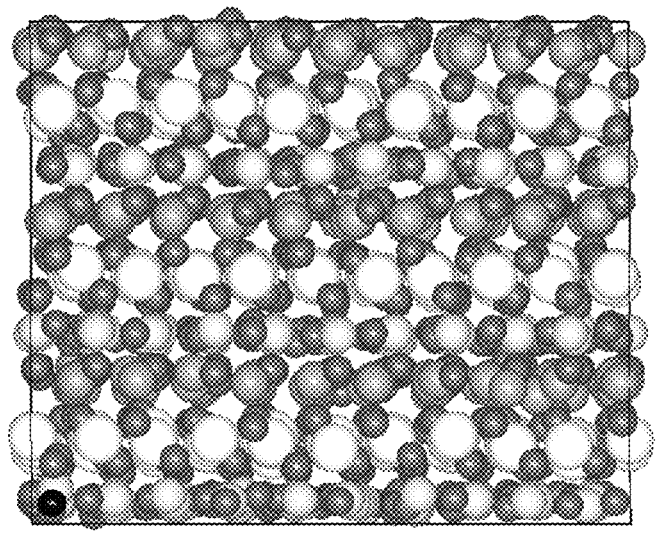
FIG. 15 is a final structure of the model in which the content of Ti is 0.59 atom %, which is obtained as a result of classical molecular dynamics simulation for 50 psec.
Figure 18:
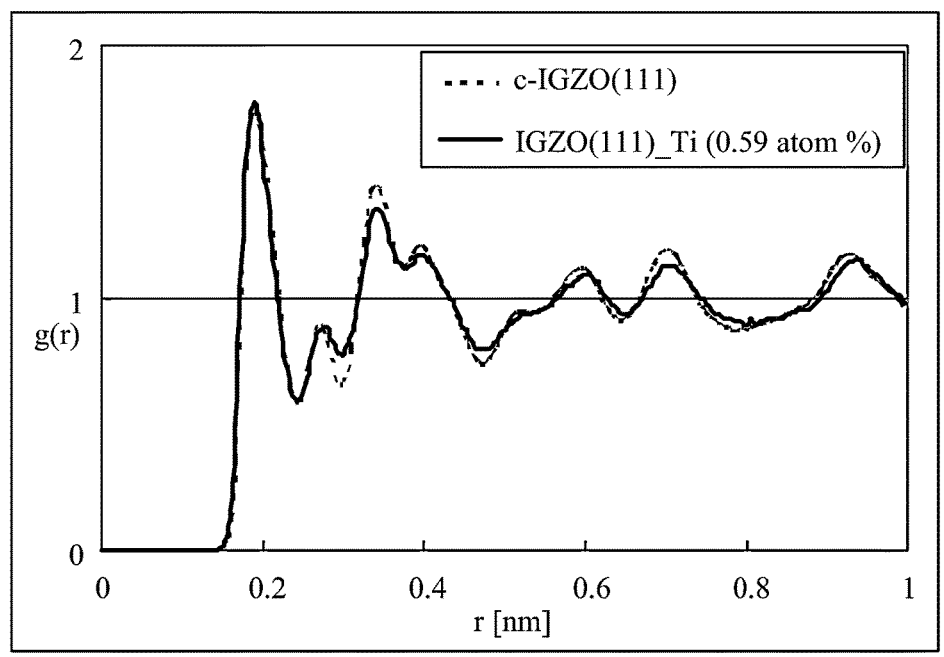
FIG. 18 shows a radial distribution function g(r) of the structural model shown in FIG. 15.

The final structure resulting from the classical molecular dynamics simulation for 50 psec performed on the model where the content of Ti is 0.59 atom % (Y=0.041) is shown in FIG. 15. The model where the content of Ti is 0.59 atom % (Y=0.041) is stable, and the crystal structure is kept even in the final structure shown in FIG. 15. The radial distribution function g(r) of the structural model shown in FIG. 15 is shown in FIG. 18. The description "IGZO(111)_Ti (0.59 atom %)" in FIG. 18 denotes the model in which one or more of Ga atoms was/were replaced with one or more of Ti atoms in IGZO (111) such that the content of Ti was 0.59 atom %; the specific composition is In:Ga:Ti:Zn=1:0.959:0.041:1.

It is found that the single crystal structure of IGZO (111) and the structural model of $InGa_XTi_YZnO_4$ (0.59 atom %, Y=0.041) both have a peak of the radial distribution function g(r) even at a long distance and a long-distance order, and thus have a crystal structure.

Figure 17:
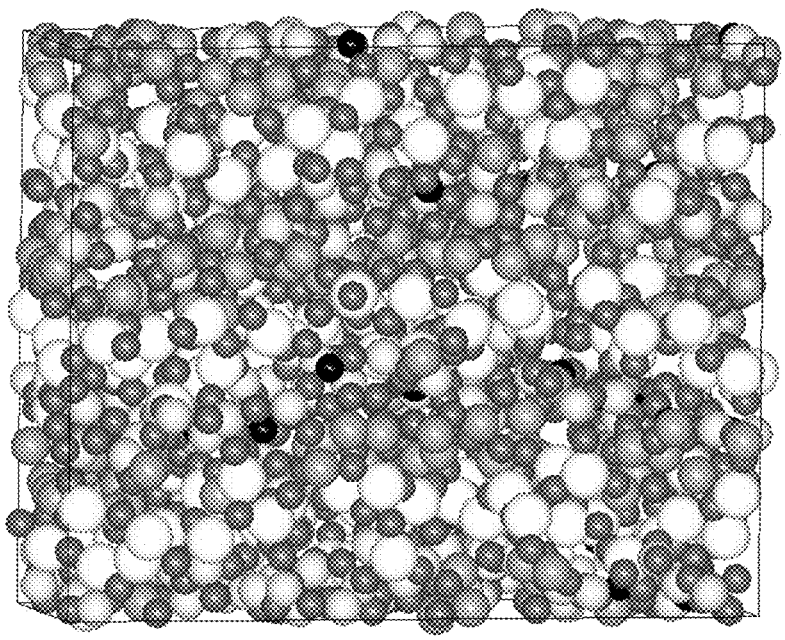
FIG. 17 is a final structure of the model in which the content of Ti is 1.77 atom %, which is obtained as a result of classical molecular dynamics simulation for 50 psec.
Figure 19:
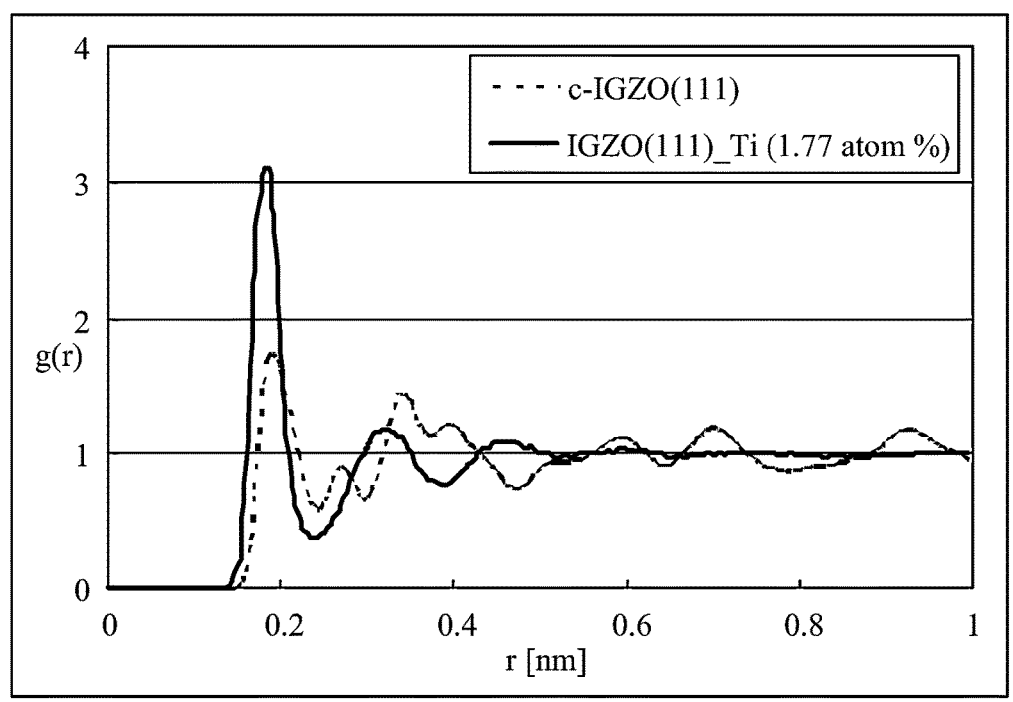
FIG. 19 shows a radial distribution function g(r) of the structural model shown in FIG. 17.

The final structure resulting from the classical molecular dynamics simulation for 50 psec performed on the model where the content of Ti is 1.77 atom % (Y=0.125) is shown in FIG. 17. The model where the content of Ti is 1.77 atom % (Y=0.125) is unstable, and the crystal structure collapses over time to change into an amorphous state shown in FIG. 17. The radial distribution function g(r) of the structural model shown in FIG. 17 is shown in FIG. 19. The description "IGZO(111)_Ti (1.77 atom %)" in FIG. 19 denotes the model in which one or more of Ga atoms was/were replaced with one or more of Ti atoms in IGZO (111) such that the content of Ti was 1.77 atom %; the specific composition is In:Ga:Ti:Zn=1:0.875:0.125:1. It is found that occurrence of the peak of the radial distribution function g(r) of the model of 1.77 atom % (Y=0.125) is stopped at about 0.6 nm, and the model of 1.77 atom % (Y=0.125) does not have a long-distance order and is in an amorphous state.

The above-described results reveal that these models containing Ti have either a crystal structure or an amorphous structure depending on the value of Y. Thus, an oxide semiconductor having a crystal structure used for a semiconductor layer of a transistor can be realized by controlling the value of X as appropriate. Further, the amorphous structure may not have a long-distance order but have a short-distance order, depending on the value of X.

Example 3

In this example, a plurality of top-gate transistor samples were fabricated using three kinds of sputtering targets whose content of Ti was different from each other, and electric characteristics thereof were measured.

Respective fabrication processes of the samples are described below.

First, a 300-nm-thick silicon oxide film is formed over a glass substrate by a sputtering method, and a planarization treatment is performed thereon by a CMP process. Next, an oxide semiconductor film is formed thereover.

For Sample 1, the oxide semiconductor film is formed using a first sputtering target whose ratio of four kinds of constituent metals, i.e., In:Ga:Ti:Zn is 3:0.99:0.01:2; and for Sample 2, the oxide semiconductor film is formed using a second sputtering target whose In:Ga:Ti:Zn is 3:0.8:0.2:2. Accordingly, sample 1 uses an $InGa_XTi_YZn_Z$-based (X=0.33, Y=0.003, Z=0.67) oxide material; Sample 2 uses an $InGa_X$-$Ti_YZn_Z$-based (X=0.27, Y=0.07, Z=0.67) oxide material. Each thickness of the oxide semiconductor films is 15 nm. The sputtering gas is only an oxygen gas, and the substrate temperature is room temperature.

Further, for a comparison example (Sample 3), the oxide semiconductor film is formed using a third sputtering target whose In:Ga:Ti:Zn is 3:0.999:0.001:2. Accordingly, Sample 3 uses an $InGa_XTi_YZn_Z$-based (X=0.333, Y=0.0003, Z=0.67) oxide material. The comparison example is fabricated under conditions which are the same as those of the other samples except the target.

Next, the oxide semiconductor film is patterned, and then, a metal film for forming a source and drain electrode layers (a 100-nm-thick tungsten film) is formed thereover.

Next, the metal film is patterned to form the source and drain electrode layers, and then, a gate insulating film is formed thereover. As the gate insulating film, a silicon oxide film is formed by a plasma-enhanced CVD method to have a thickness of 30 nm.

Next, as a metal film for forming a gate electrode, a 30-nm-thick tantalum nitride film and a 200-nm-thick tungsten film are formed to be stacked in this order by a sputtering method. This metal film of the stacked layers is patterned to form the gate electrode.

Next, a 70-nm-thick aluminum oxide film is formed by a sputtering method, and a 460-nm-thick silicon oxide film is formed thereover by a plasma-enhanced CVD method; in this manner, a first interlayer insulating film is formed. Then, a wiring reaching the source or drain electrode layer (a three-layer stacked layer of a 50-nm-thick titanium film, a 100-nm-thick aluminum film, and a 50-nm-thick titanium film) is formed, and a polyimide film serving as a second interlayer insulating film is formed thereover to have a thickness of 1.5 μm. Then, a heat treatment is performed thereon in the air atmosphere at 300° C. for one hour. In this manner, the samples are fabricated.

Figure 20A:
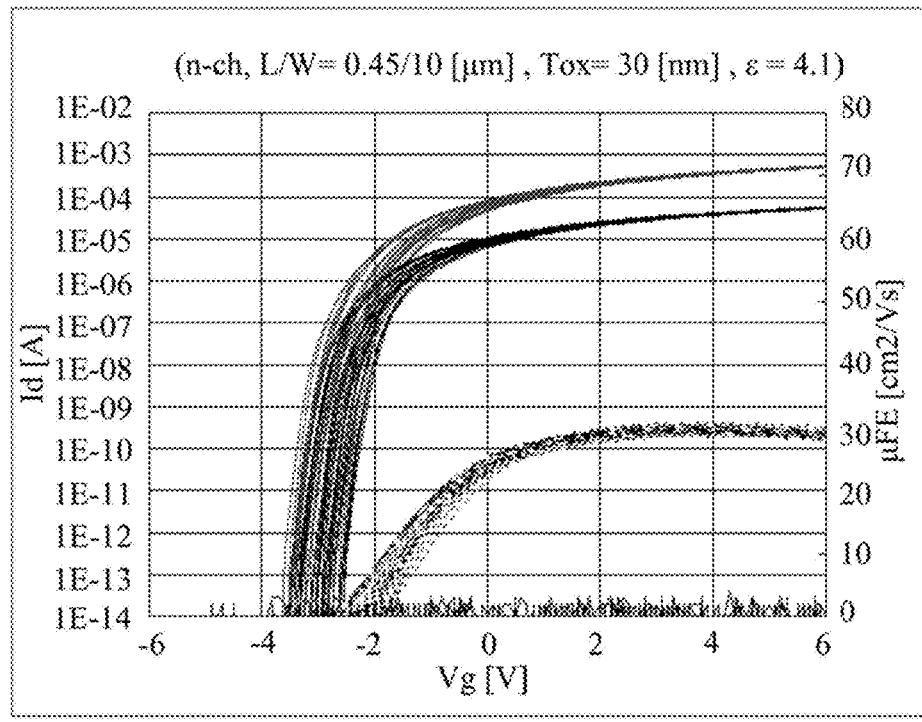
FIGS. 20A and 20B are graphs showing characteristics of transistors.
Figure 20B:
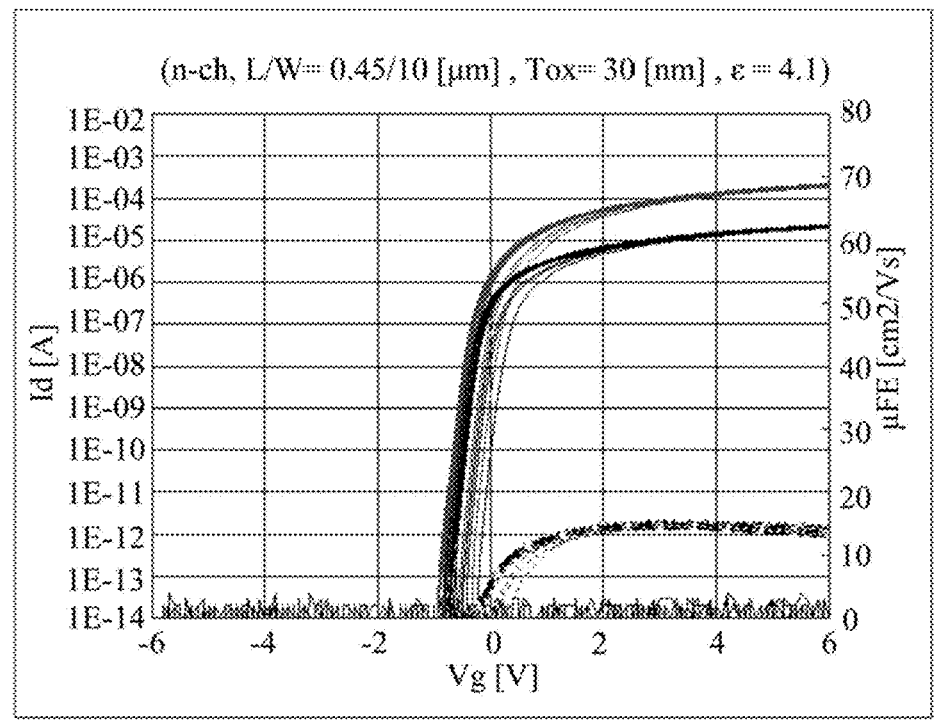

The electric characteristics of the transistor of Sample 1 are shown in FIG. 20A, and those of the transistor of Sample 2 are shown in FIG. 20B. To measure the initial characteristics of the transistor, the characteristics regarding changes in the source-drain current (hereinafter referred to as drain current or Id), i.e., Vg-Id characteristics, were measured under the conditions that the substrate temperature was room temperature (25° C.), the source-drain voltage (hereinafter referred to as drain voltage or Vd) was 3 V, and the source-gate voltage (hereinafter referred to as gate voltage or Vg) was changed from −6 V to +6 V. Comparison between FIG. 20A and FIG. 20B revealed that the threshold voltage of the transistor is closer to 0 V in Sample 2 whose content of Ti is larger. The threshold voltage of the transistor of Sample 2 was about −0.7 V; that of the transistor of Sample 1 was about −3 V.

Figure 21:
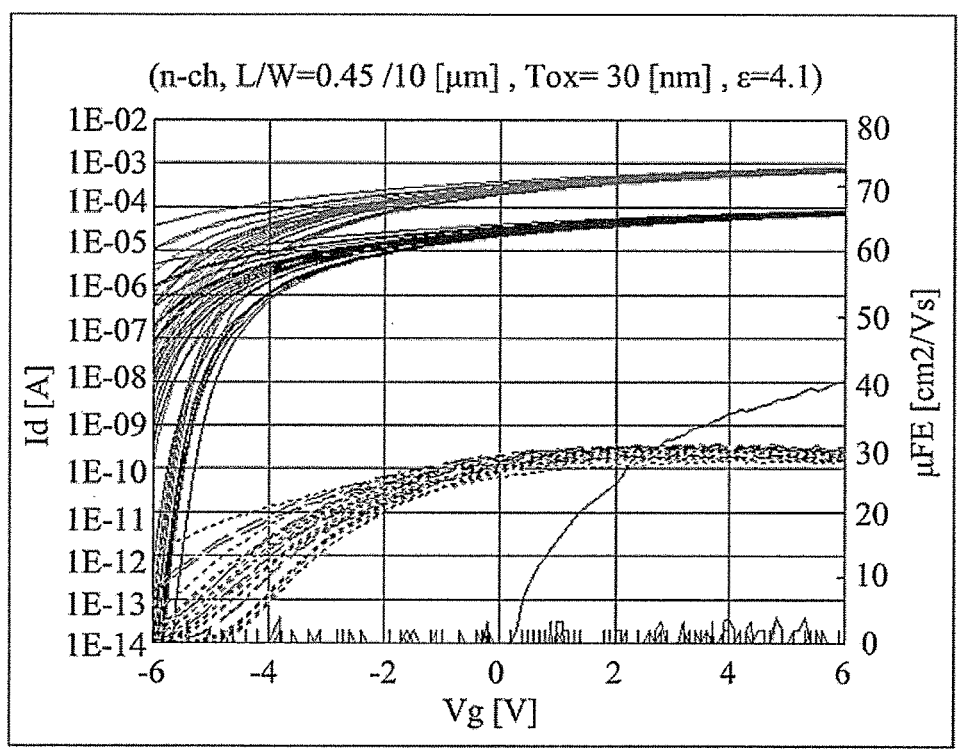
FIG. 21 is a graph of a comparison example.

Further, the electric characteristics of the transistor of Sample 3, which is the comparison example, are shown in FIG. 21. The threshold voltage of the transistor of Sample 3 whose content of Ti is the least was about −5.6 V.

The results shown in FIGS. 20A and 20B and FIG. 21 imply that the threshold value gets closer to 0 as the content of Ti is increased. Further, the more the content of Ti, the lesser variation in electric characteristics of the transistor.

The size of each transistor was the following: a channel width W of 10 μm and a channel length L of 0.45 μm. Further, the distance (length in the channel length direction) where the gate electrode is overlapped with the source electrode layer was 1 μm, and the distance (length in the channel length direction) where the gate electrode is overlapped with the drain electrode layer was 1 μm.

Further, though not shown, samples were fabricated in which only the channel length L was changed to 0.65 μm, 1 μm, and 10 μm in Sample 1, Sample 2, and Sample 3, and electric characteristics thereof were measured in a similar manner. It was shown that the more the channel length L is, the more the threshold voltage of the transistor of the sample is closer to 0 V. The threshold voltage of the transistor of the sample with a channel length L of 10 μm which uses a target which is the same as that of Sample 2 was about −0.01 V. On the other hand, the threshold voltage of the transistor of the sample with a channel length L of 10 μm which uses a target which is the same as that of Sample 1 was about −0.15 V.

Also of the comparison example, it was shown that the more the channel length L is, the more the threshold voltage of the transistor of the sample using a target which is the same as that of Sample 3 is closer to 0 V. The threshold voltage of the transistor of the sample with a channel length L of 10 μm which uses the target which is the same as that of Sample 3 was about −0.6 V.

In this example, it was confirmed that a transistor with a channel length as short as 0.45 μm can be fabricated using an $InGa_XTi_YZn_Z$-based ($0<X\leq1$, $0<Y<1$, $Y<1$, $Y<X$, and $0<Z$) oxide material. Further, the threshold voltage of the transistor can be controlled by adjusting the content of Ti in the InGaTiZn-based oxide material as appropriate.

EXPLANATION OF REFERENCE

135: insulating layer; 142a: electrode layer; 142b: electrode layer; 162: transistor; 250: memory cell; 251: memory cell array; 251a: memory cell array; 251b: memory cell array; 253: peripheral circuit; 254: capacitor; 256: insulating film; 258: insulating film; 260: wiring; 262: conductive layer; 400: substrate; 401: gate electrode layer; 402: gate insulating layer; 403: oxide semiconductor layer; 403a: low-resistance region; 403b: low-resistance region; 403c: channel formation region; 405a: source electrode layer; 405b: drain electrode layer; 406: insulating layer; 407: insulating layer; 412a: sidewall insulating layer; 412b: sidewall insulating layer; 413: insulating layer; 414: insulating layer; 415: insulating layer; 420: transistor; 421: transistor; 422: transistor; 423: transistor; 424: transistor; 425: transistor; 426: transistor; 435a: opening; 435b: opening; 436: base insulating layer; 465a: source wiring layer; 465b: drain wiring layer; 500: substrate; 501: insulating film; 502: gate insulating layer; 503: insulating layer; 504: interlayer insulating film; 505: color filter layer; 506: insulating film; 507: bank; 510: transistor; 511a: gate electrode layer; 511b: gate electrode layer; 512: oxide semiconductor layer; 513a: conductive layer; 513b: conductive layer; 520: capacitor; 521a: conductive layer; 521b: conductive layer; 522: oxide semiconductor layer; 523: conductive layer; 530: intersection of wiring layers; 533: conductive layer; 540: light-emitting element; 541: electrode layer; 542: electroluminescent layer; 543: electrode layer; 4001: substrate; 4002: pixel portion; 4003: signal line driver circuit; 4004: scan line driver circuit; 4005: sealant; 4006: substrate; 4008: liquid crystal layer; 4010: transistor; 4011: transistor; 4013: liquid crystal element; 4015: connection terminal electrode; 4016: terminal electrode; 4018: FPC; 4019: anisotropic conductive film; 4020: insulating film; 4021: insulating film; 4023: insulating film; 4024: insulating film; 4030: electrode layer; 4031: electrode layer; 4032: insulating film; 4033: insulating film; 4035: spacer; 4510: bank; 4511: electroluminescent layer; 4513: light-emitting element; 4514: filler; 9000: table; 9001: housing; 9002: leg portion; 9003: display portion; 9004: displayed button; 9005: power cord; 9033: fastener; 9034: switch; 9035: power switch; 9036: switch; 9038: operation switch; 9100: television set; 9101: housing; 9103: display portion; 9105: stand; 9107: display portion; 9109: operation key; 9110: remote controller; 9201: main body; 9202: bezel; 9203: display portion; 9204: keyboard; 9205: external connection port; 9206: pointing device; 9630: housing; 9631: display portion; 9631a: display portion; 9631b: display portion; 9632a: region; 9632b: region; 9633: solar cell; 9634: charge and discharge control circuit; 9635: battery; 9636: DCDC converter; 9637: converter; 9638: operation key; 9639: button This application is based on Japanese Patent Application serial no. 2011-236577 filed with Japan Patent Office on Oct. 28, 2011, the entire contents of which are hereby incorporated by reference.

The invention claimed is:

1. A semiconductor device comprising:
  an oxide semiconductor layer;
  a source electrode layer and a drain electrode layer in contact with the oxide semiconductor layer;
  a first insulating layer over the source electrode layer and the drain electrode layer;
  a second insulating layer over the first insulating layer, the second insulating layer being in contact with a top surface of the first insulating layer and a side surface of the first insulating layer;
  a gate insulating layer over the oxide semiconductor layer;
  a gate electrode layer over the gate insulating layer;
  a third insulating layer over the gate electrode layer; and
  sidewall insulating layers covering side surfaces of the gate electrode layer and side surfaces of the third insulating layer,
  wherein a part of the source electrode layer and a part of the drain electrode layer each are between the second insulating layer and the sidewall insulating layers,
  wherein the oxide semiconductor layer comprises an oxide material comprising In, M1, M2, and Zn, in which the M1 is an element in a group 13 of a periodic table and the M2 is an element whose content is less than a content of the M1,
  wherein the M2 is one selected from the group consisting of titanium, zirconium, hafnium, germanium, and tin,
  wherein the oxide semiconductor layer comprising a first region, a second region and a channel formation region between the first region and the second region, and
  wherein a width of the oxide semiconductor layer in a direction perpendicular to a channel length direction is smaller than a width of the source electrode layer or the drain electrode layer in the direction perpendicular to the channel length direction.

2. The semiconductor device according to claim 1, wherein the M1 is gallium.

3. The semiconductor device according to claim 1, wherein the M2 is titanium.

4. The semiconductor device according to claim 1, wherein the content of the M2 is greater than or equal to 1% and less than 50% of the content of the M1.

5. A semiconductor device comprising:
an oxide semiconductor layer;
a source electrode layer and a drain electrode layer in contact with the oxide semiconductor layer;
a first insulating layer over the source electrode layer and the drain electrode layer;
a second insulating layer over the first insulating layer, the second insulating layer being in contact with a top surface of the first insulating layer and a side surface of the first insulating layer;
a gate insulating layer over the oxide semiconductor layer;
a gate electrode layer over the gate insulating layer;
a third insulating layer over the gate electrode layer; and
sidewall insulating layers covering side surfaces of the gate electrode layer and side surfaces of the third insulating layer,
wherein a part of the source electrode layer and a part of the drain electrode layer each are between the second insulating layer and the sidewall insulating layers,
wherein the oxide semiconductor layer comprises an oxide material comprising In, M1, M2, and Zn, in which the M1 is an element in a group 13 of a periodic table and the M2 is an element whose content is less than a content of the M1, and
wherein the M2 is one selected from the group consisting of titanium, zirconium, hafnium, germanium, and tin.

6. The semiconductor device according to claim 5, wherein the M1 is gallium.

7. The semiconductor device according to claim 5, wherein the M2 is titanium.

8. The semiconductor device according to claim 5, wherein the content of the M2 is greater than or equal to 1% and less than 50% of the content of the M1.

9. The semiconductor device according to claim 5,
wherein a width of the oxide semiconductor layer in a direction perpendicular to a channel length direction is smaller than a width of the source electrode layer or the drain electrode layer in the direction perpendicular to the channel length direction.

10. The semiconductor device according to claim 5,
wherein the oxide semiconductor layer comprising a first region, a second region and a channel formation region between the first region and the second region,
wherein resistance of each of the first region and the second region is lower than that of the channel formation region, and
wherein the first region and the second region overlap with the sidewall insulating layers.

11. The semiconductor device according to claim 10,
wherein the source electrode layer and the drain electrode layer are over and in contact with the first region and the second region and in contact with side surfaces of sidewall insulating layers.

12. The semiconductor device according to claim 1,
wherein the M1 is gallium,
wherein the M2 is titanium, and
wherein a content of titanium atoms in the oxide semiconductor layer is greater than or equal to 0.59% and less than 1.77% of a content of all of the atoms in the oxide semiconductor layer.

13. The semiconductor device according to claim 5,
wherein the M1 is gallium,
wherein the M2 is titanium, and
wherein a content of titanium atoms in the oxide semiconductor layer is greater than or equal to 0.59% and less than 1.77% of a content of all of the atoms in the oxide semiconductor layer.

14. The semiconductor device according to claim 5, further comprising:
a fourth insulating layer over and in contact with the source electrode layer, the drain electrode layer, the first insulating layer, the second insulating layer, the third insulating layer, and the sidewall insulating layers.

15. The semiconductor device according to claim 1,
wherein resistance of each of the first region and the second region is lower than that of the channel formation region, and
wherein the first region and the second region overlap with the sidewall insulating layers.

16. The semiconductor device according to claim 15,
wherein the source electrode layer and the drain electrode layer are over and in contact with the first region and the second region and in contact with side surfaces of sidewall insulating layers.

17. The semiconductor device according to claim 1, further comprising:
a fourth insulating layer over and in contact with the source electrode layer, the drain electrode layer, the first insulating layer, the second insulating layer, the third insulating layer, and the sidewall insulating layers.

* * * * *